(12) United States Patent
Ku et al.

(10) Patent No.: US 11,145,536 B2
(45) Date of Patent: *Oct. 12, 2021

(54) GATE DIELECTRIC PRESERVING GATE CUT PROCESS

(71) Applicant: Taiwan Semiconductor Manufacturing Co., Ltd., Hsin-Chu (TW)

(72) Inventors: Shu-Yuan Ku, Hsinchu County (TW); Chih-Ming Sun, New Taipei (TW); Chun-Fai Cheng, Tin Shui Wai (HK)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/709,291

(22) Filed: Dec. 10, 2019

(65) Prior Publication Data

US 2020/0111700 A1    Apr. 9, 2020

Related U.S. Application Data

(62) Division of application No. 15/963,297, filed on Apr. 26, 2018, now Pat. No. 10,699,940.

(Continued)

(51) Int. Cl.
 *H01L 21/70* (2006.01)
 *H01L 21/762* (2006.01)
(Continued)

(52) U.S. Cl.
 CPC .. *H01L 21/76232* (2013.01); *H01L 21/32134* (2013.01); *H01L 21/32135* (2013.01);
(Continued)

(58) Field of Classification Search
 CPC ......... H01L 21/308–3088; H01L 21/32; H01L 21/469–47576; H01L 51/0018;
(Continued)

(56) References Cited

U.S. PATENT DOCUMENTS 8,106,459 B2    1/2012  Chang et al.
9,362,282 B1 *  6/2016  Ando ................... H01L 29/517
(Continued)

FOREIGN PATENT DOCUMENTS

CN          102646680 A       8/2012

*Primary Examiner* — Calvin Y Choi
(74) *Attorney, Agent, or Firm* — Haynes and Boone, LLP

(57) ABSTRACT

Gate cutting techniques for integrated circuit devices, particularly for fin-like field effect transistor devices, are disclosed herein. An exemplary method includes receiving an integrated circuit device that includes a gate structure and performing a gate cut process to separate the gate structure into a first gate structure and a second gate structure. The gate cut process includes selectively removing a portion of the gate structure, such that a residual gate dielectric layer extends between the first gate structure and the second gate structure. In some implementations, the residual gate dielectric includes a high-k dielectric material. The method further includes forming a gate isolation region between the first gate structure and the second gate structure.

20 Claims, 17 Drawing Sheets

Related U.S. Application Data

(60) Provisional application No. 62/588,834, filed on Nov. 20, 2017.

(51) Int. Cl.
  *H01L 21/3213*  (2006.01)
  *H01L 21/8238*  (2006.01)
  *H01L 29/78*  (2006.01)
  *H01L 21/8234*  (2006.01)
  *H01L 27/088*  (2006.01)
  *H01L 21/28*  (2006.01)
  *H01L 29/66*  (2006.01)

(52) U.S. Cl.
  CPC .. *H01L 21/32139* (2013.01); *H01L 21/76224* (2013.01); *H01L 21/823481* (2013.01); *H01L 21/823821* (2013.01); *H01L 21/823878* (2013.01); *H01L 27/088* (2013.01); *H01L 29/4011* (2019.08); *H01L 29/785* (2013.01); *H01L 21/823437* (2013.01); *H01L 29/66795* (2013.01)

(58) Field of Classification Search
  CPC ..... H01L 21/0273–2079; H01L 21/312–3128; H01L 21/02013; H01L 21/02024; H01L 21/304–3046; H01L 21/02019; H01L 21/02071; H01L 29/7855–7856; H01L 2029/7858; H01L 21/823431; H01L 21/823821; H01L 27/0886; H01L 27/0924; H01L 27/10826; H01L 27/10879; H01L 27/1211; H01L 21/76232; H01L 21/76224; H01L 21/823878; H01L 29/401; H01L 29/75; H01L 29/66795; C23F 1/00–46; C23F 1/16–30; C23F 1/32–40; C25F 3/02–14; H01J 2237/334–3348
  USPC ........................................................ 257/368
  See application file for complete search history.

(56) References Cited

U.S. PATENT DOCUMENTS

| | | | |
|---|---|---|---|
| 9,520,482 B1 | 12/2016 | Chang et al. | |
| 9,659,786 B2 | 5/2017 | Greene et al. | |
| 10,699,940 B2* | 6/2020 | Ku | H01L 21/823481 |
| 2012/0018813 A1* | 1/2012 | Holmes | H01L 21/82345 257/392 |
| 2013/0078773 A1* | 3/2013 | Xu | H01L 21/8238 438/229 |
| 2014/0103429 A1* | 4/2014 | Chuang | H01L 29/66681 257/335 |
| 2014/0134844 A1* | 5/2014 | Tegen | H01L 21/823431 438/702 |
| 2016/0133632 A1* | 5/2016 | Park | H01L 29/66545 257/369 |

* cited by examiner

GATE DIELECTRIC PRESERVING GATE CUT PROCESS

The present application is a divisional application of U.S. patent application Ser. No. 15/963,297, filed Apr. 26, 2018, which is a non-provisional application of and claims benefit of U.S. Patent Application Ser. No. 62/588,834, filed Nov. 20, 2017, the entire disclosures of which are incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, conventional gate cutting techniques are significantly constrained by the dense packing of IC features required for advanced IC technology nodes. In particular, gate cutting techniques typically implement etching processes that completely (or substantially) remove an entire portion of a gate stack (including, for example, at least one gate electrode layer and at least one gate dielectric layer). However, it has been observed that lateral etching arising from these etching processes can damage surrounding features of the ICs, such as the source/drain features. Accordingly, although existing gate cutting techniques and resulting gate structures have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-5A, FIGS. 2B-5B, FIGS. 2C-5C, and FIGS. 2D-5D are fragmentary diagrammatic views of an integrated circuit device, in portion or entirety, at various fabrication stages (such as those associated with the method in FIG. 1) according to various aspects of the present disclosure.

DETAILED DESCRIPTION

Figure 1:
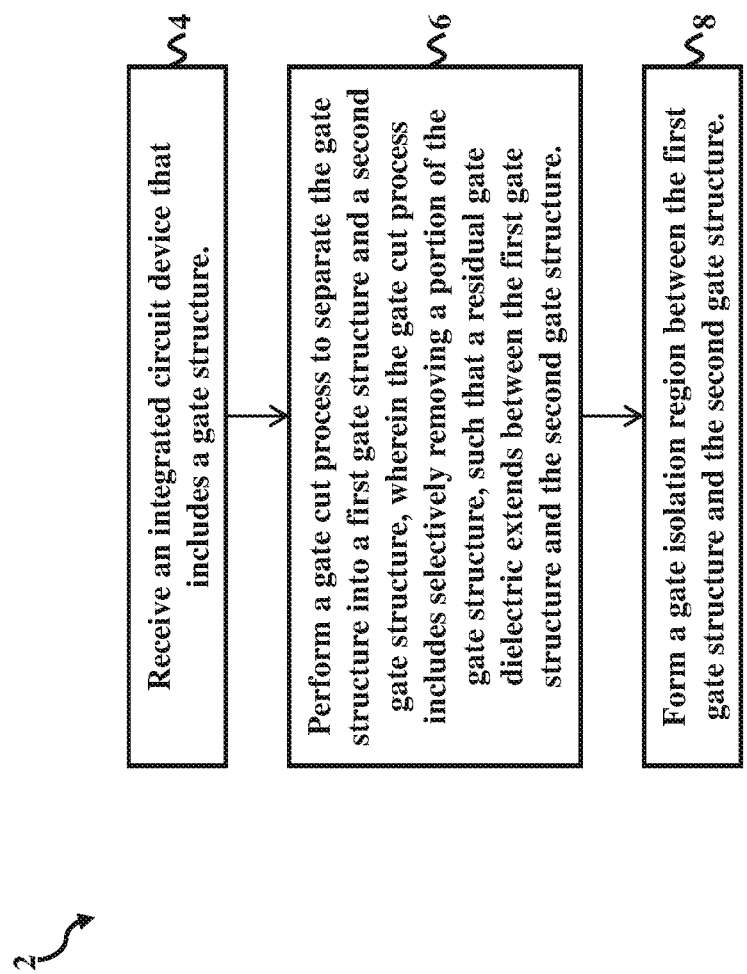
FIG. 1 is a flow chart of a method for fabricating an integrated circuit device according to various aspects of the present disclosure.
Figure 2A:
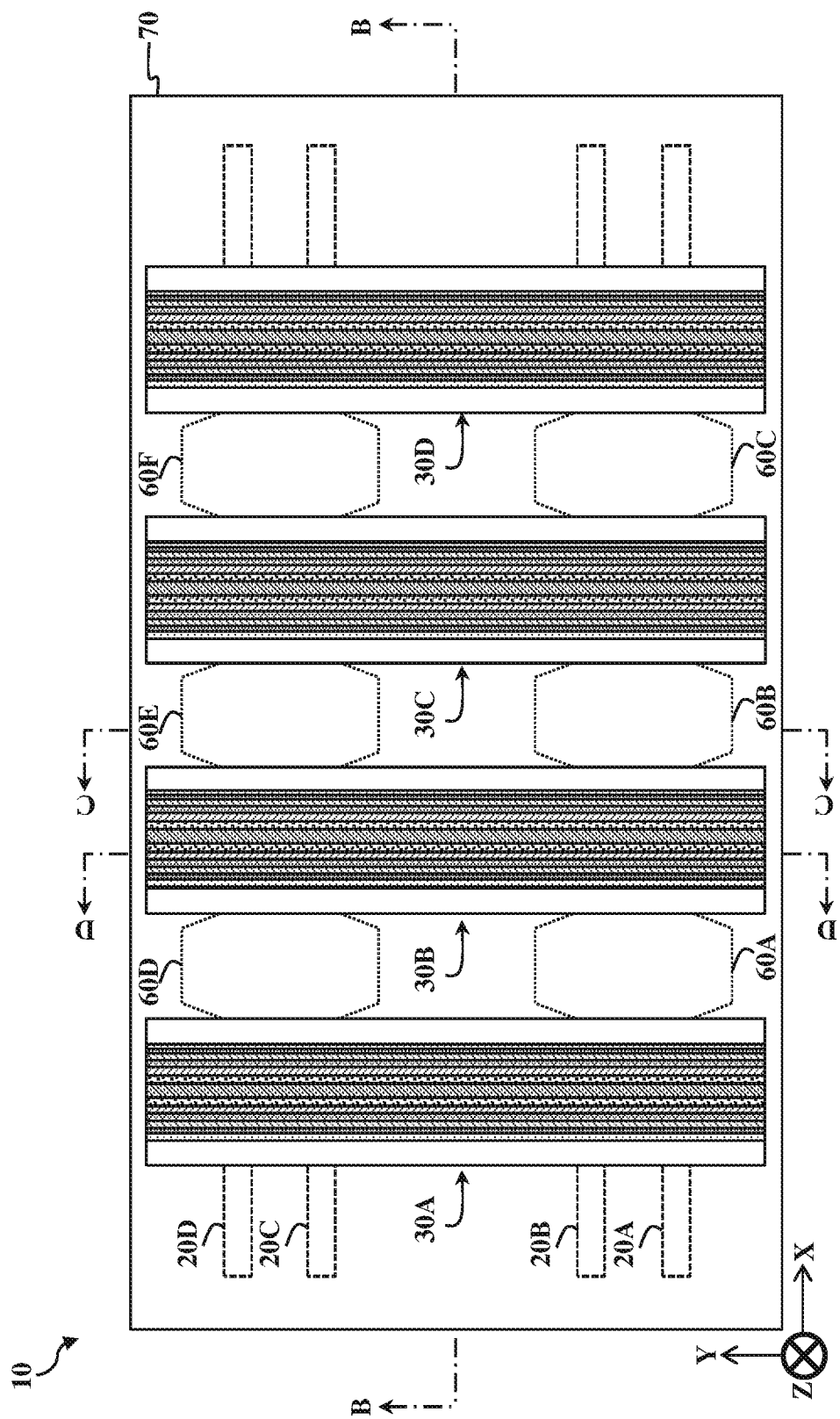
Figure 2B:
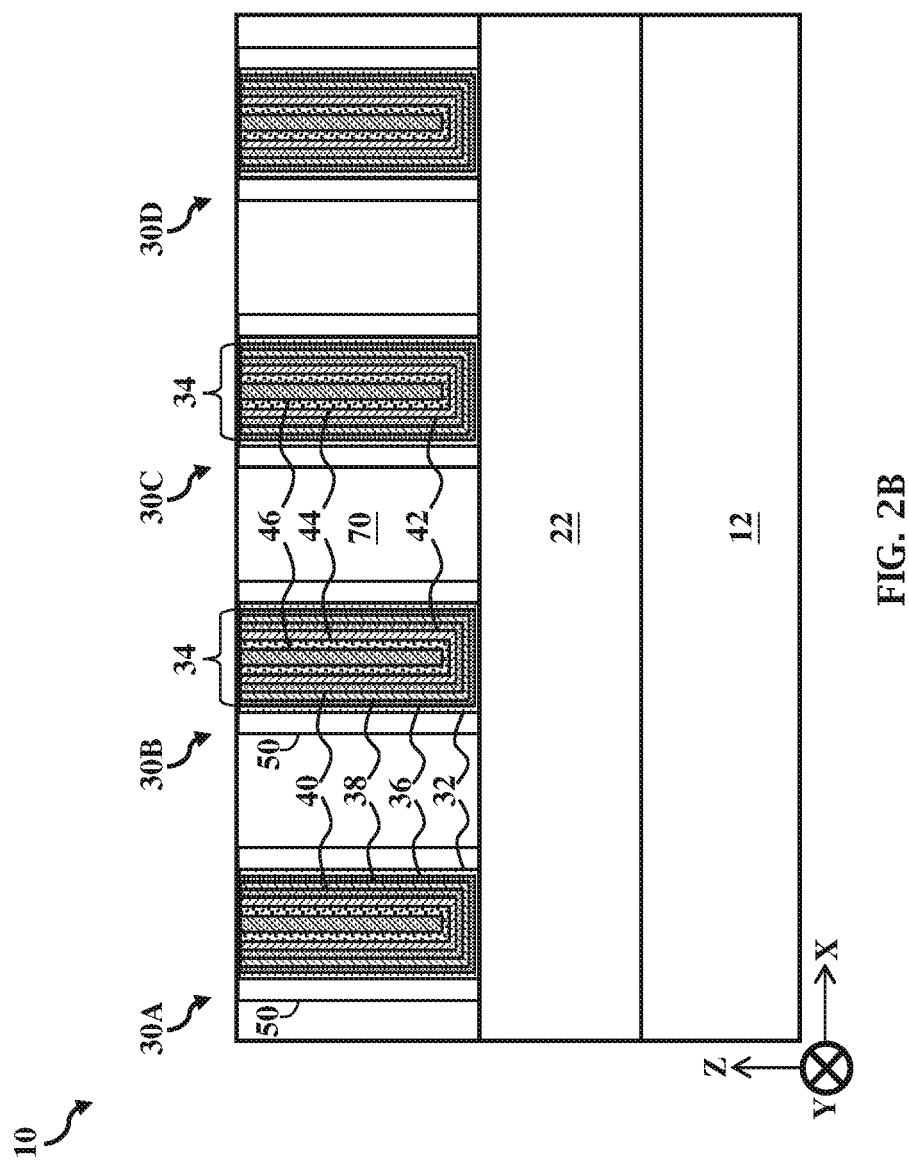
Figure 2C:
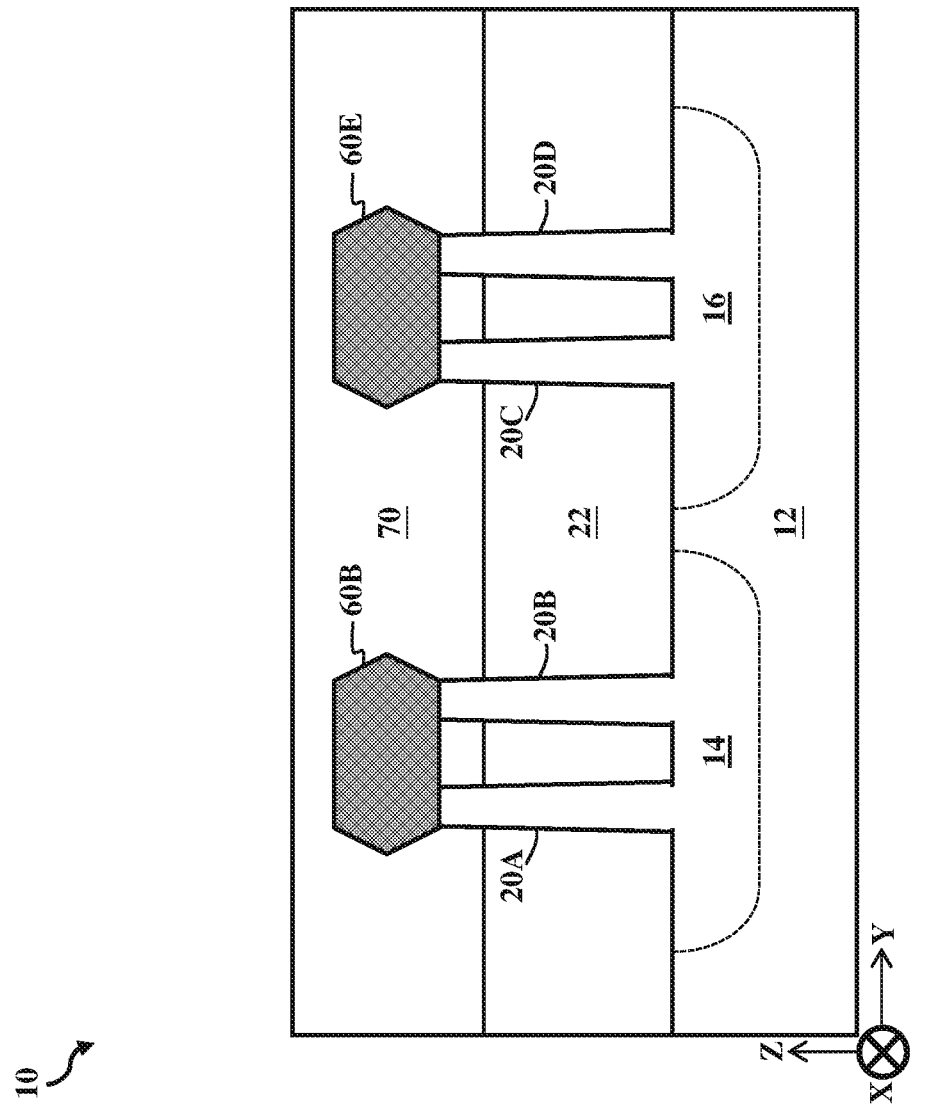
Figure 2D:
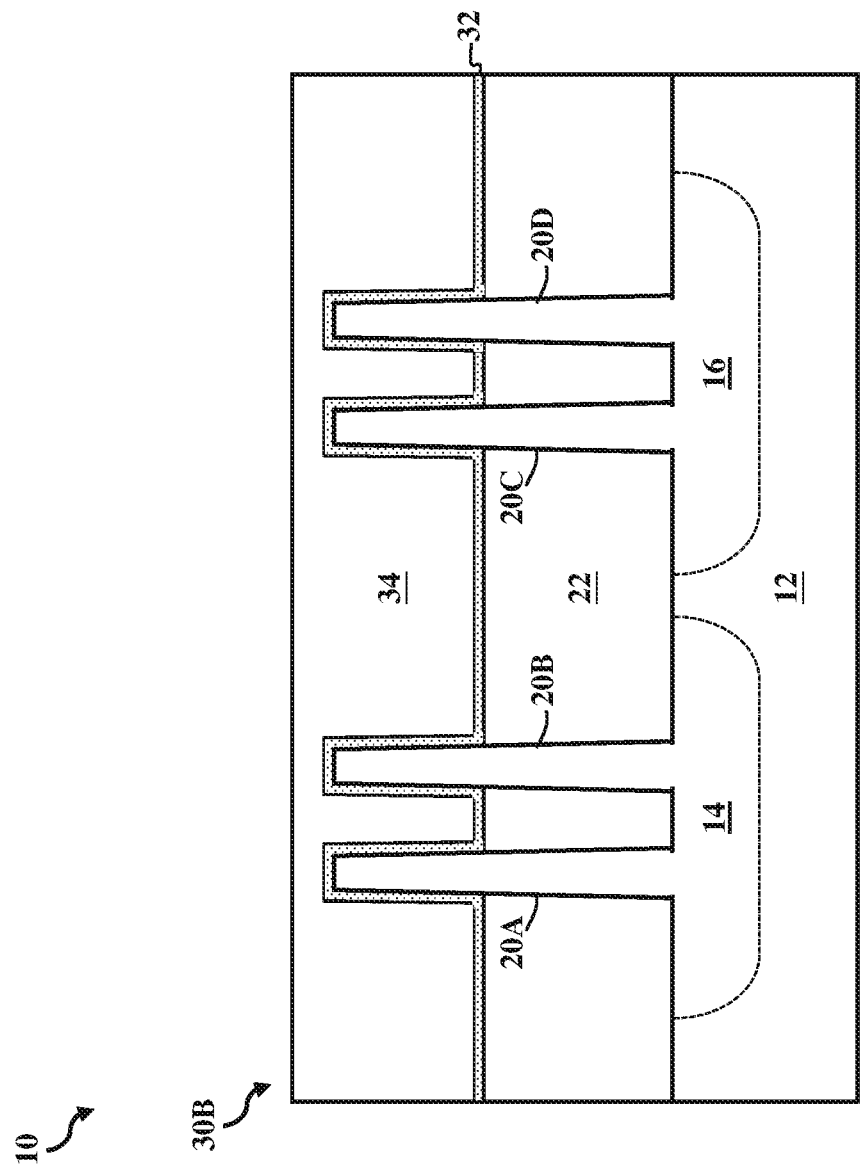
Figure 3A:
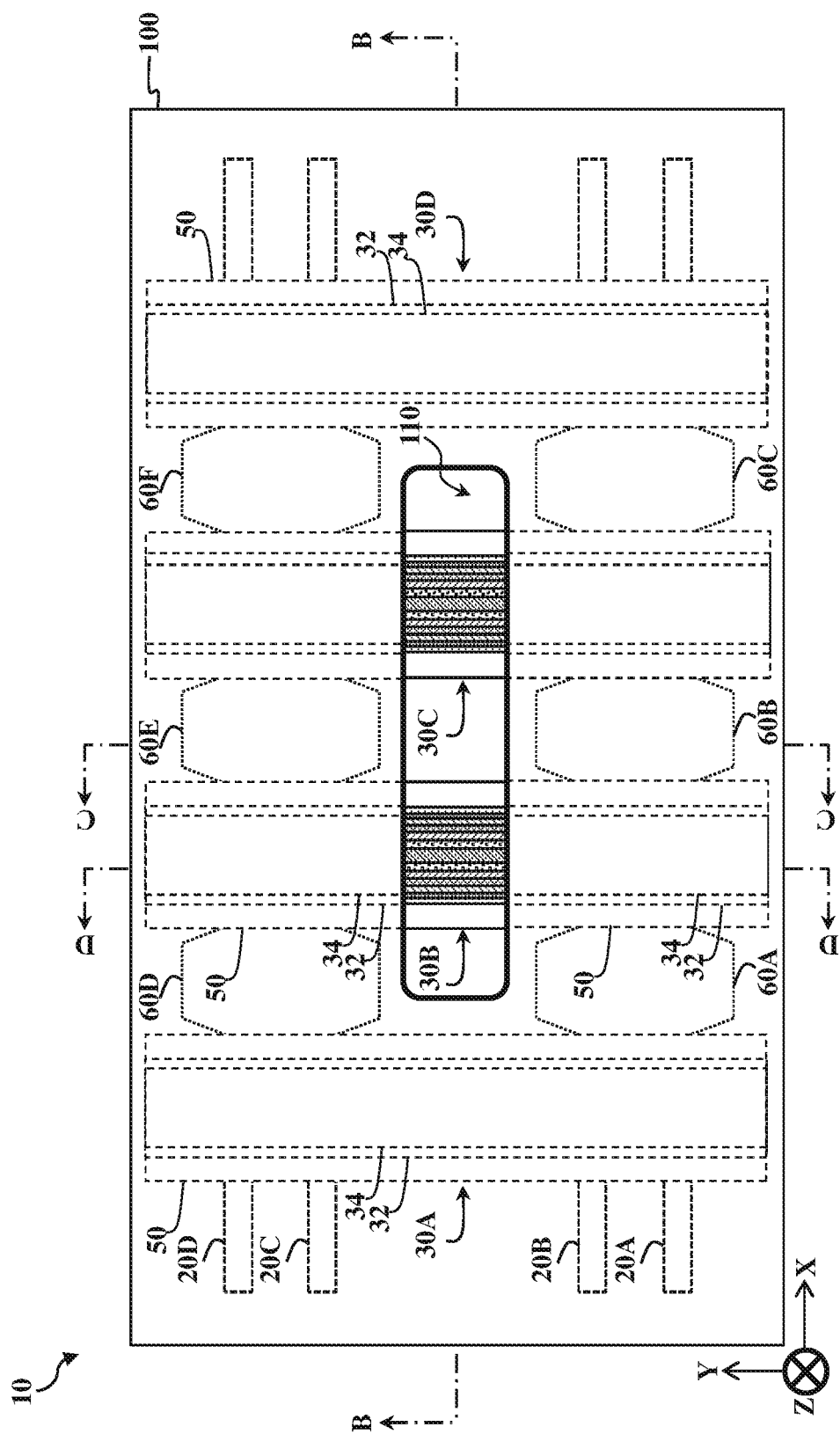
Figure 3B:
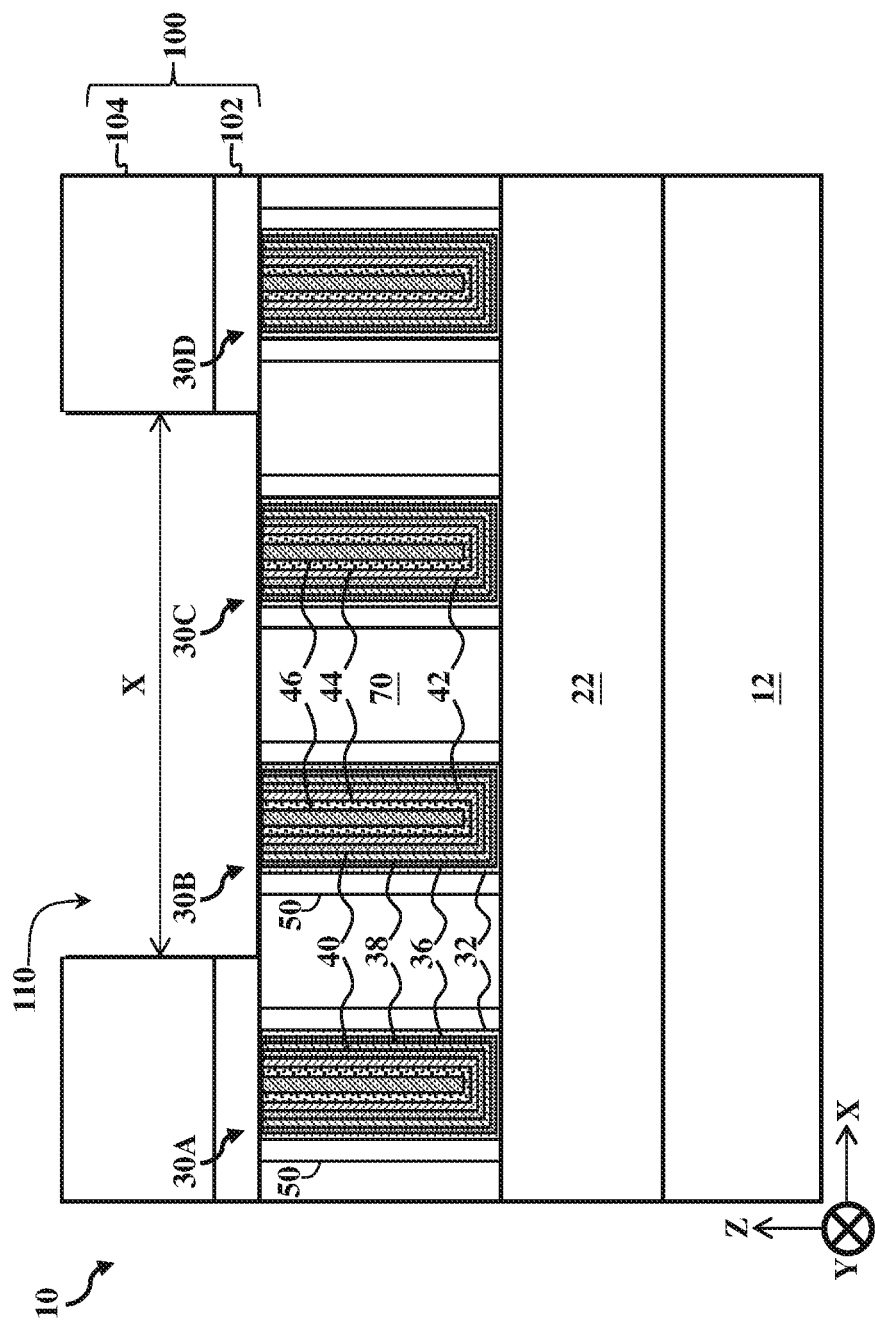
Figure 3C:
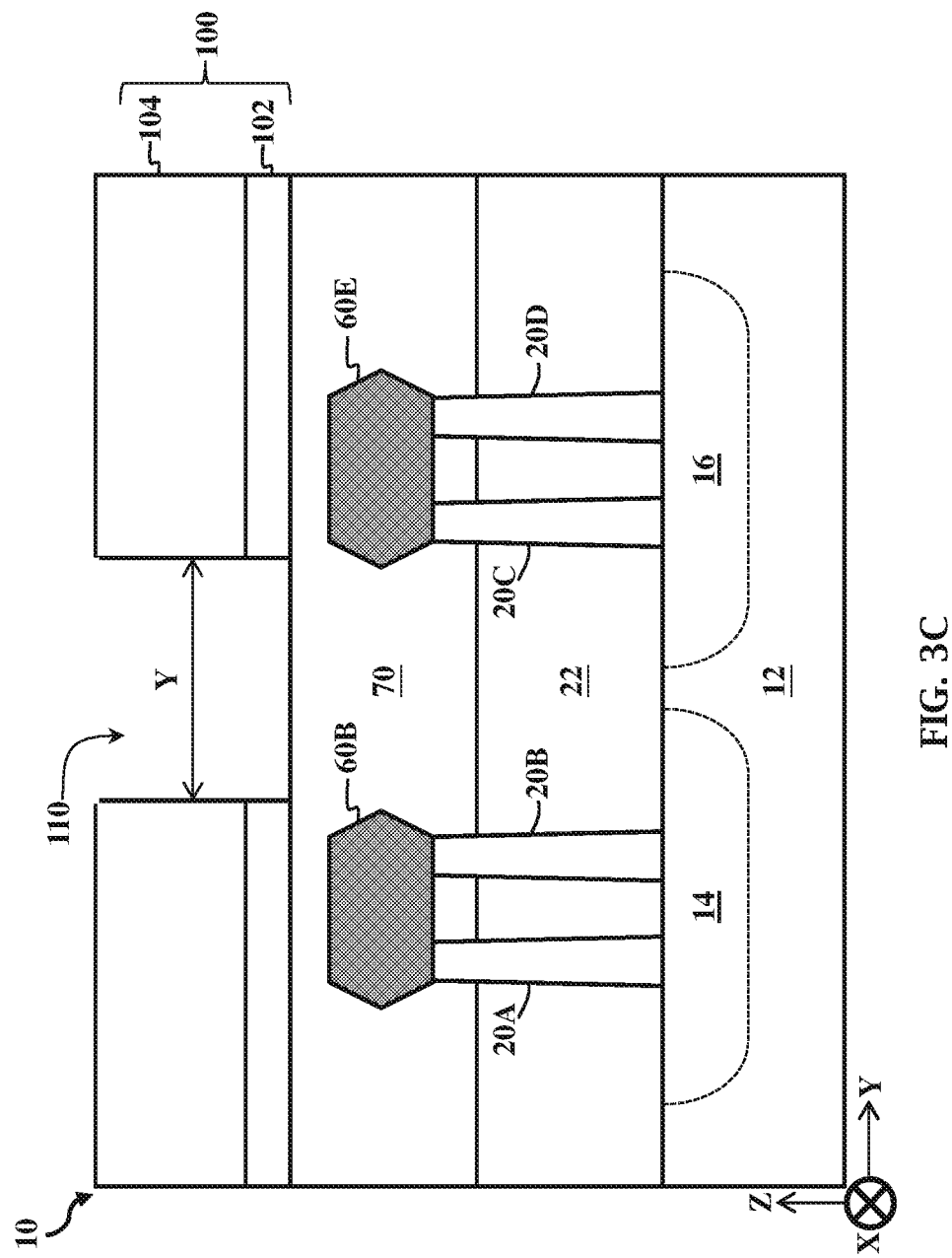
Figure 3D:
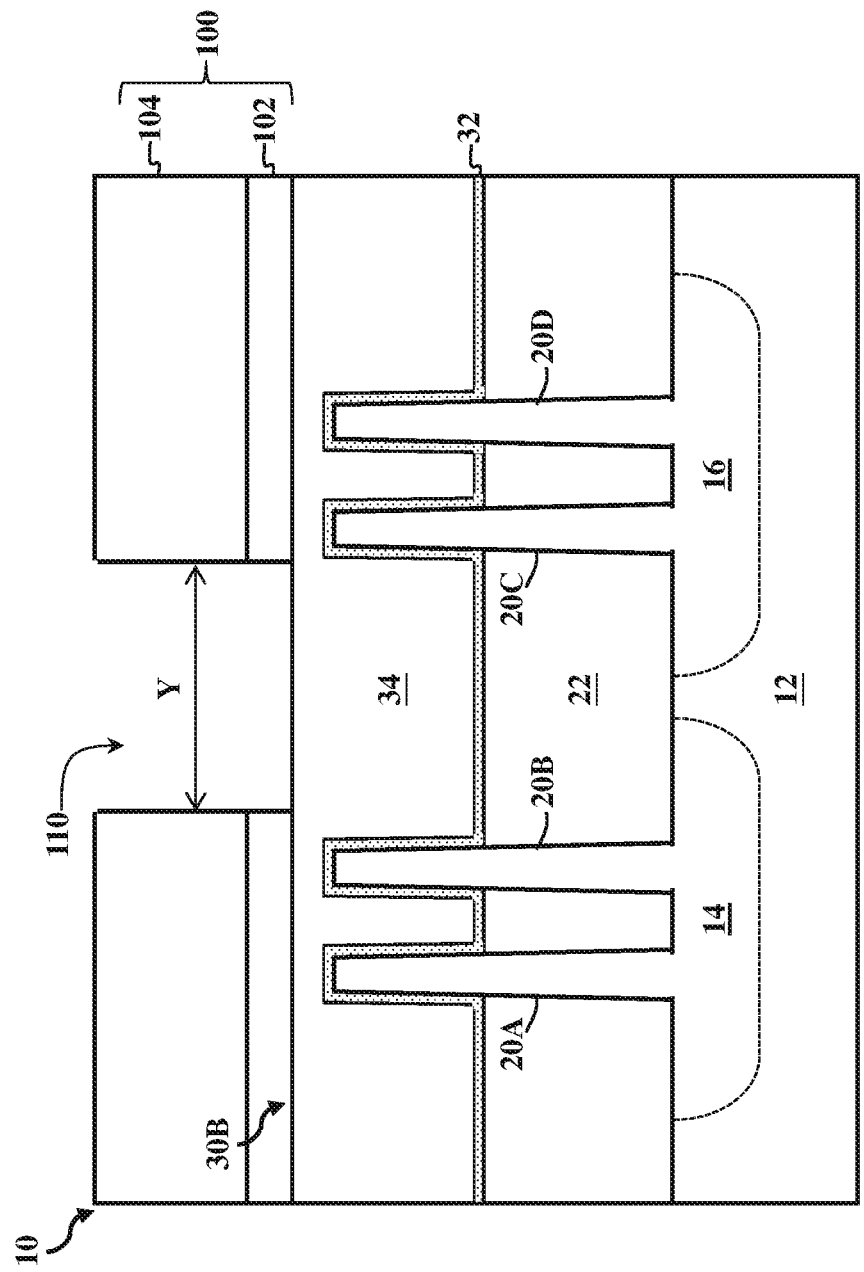

The present disclosure relates generally to integrated circuit devices, and more particularly, to gate cutting techniques for integrated circuit devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

As FinFET technologies progress towards smaller technology nodes (such as 16 nm, 10 nm, 7 nm, 5 nm, and below), conventional gate cutting techniques are significantly constrained by the densely packed features required for such technology nodes. For example, gate cutting techniques typically implement etching processes that completely (or substantially) remove an entire portion of a gate stack, which includes a gate electrode and a gate dielectric. It has been observed that lateral etching arising from these etching processes can damage closely-spaced surrounding features, such as the source/drain features. Gate cutting techniques disclosed herein overcome such challenges by preserving the gate dielectric, which protects nearby source/drain features from the etching processes. Such gate cutting techniques have been observed to increase FinFET reliability and/or FinFET yield.

FIG. 1 is a flow chart of a method 2 for fabricating an integrated circuit device according to various aspects of the present disclosure. At block 4, method 2 includes receiving an integrated circuit device that includes a gate structure. In some implementations, the gate structure is disposed over a fin structure. At block 6, method 2 includes performing a gate cut process to separate the gate structure into a first gate structure and a second gate structure, wherein the gate cut process includes selectively removing a portion of the gate structure, such that a residual gate dielectric extends between the first gate structure and the second gate structure. In some implementations, the first gate structure corresponds with a first FinFET and the second gate structure corresponds with a second FinFET. At block 8, method 2 includes forming a gate isolation region between the first gate structure and the second gate structure. In some implementations, the gate isolation region is formed by filling an opening formed between the first gate structure and the second gate structure during the gate cut process with a dielectric material. In some implementations, the gate isolation region includes an interlevel dielectric layer. Method 2 can continue to complete fabrication of the integrated circuit device. For example, a multi-layer interconnect structure can be fabricated for facilitating operation of the integrated circuit device, such as operation of the first FinFET and the second FinFET. Additional steps can be provided before, during, and after method 2, and some of the steps described can be moved, replaced, or eliminated for additional embodiments of method 2.

FIGS. 2A-5A, FIGS. 2B-5B, FIGS. 2C-5C, and FIGS. 2D-5D are fragmentary diagrammatic views of an integrated circuit device 10, in portion or entirety, at various fabrication stages (such as those associated with method 2 in FIG. 1) according to various aspects of the present disclosure. In particular, FIGS. 2A-5A are top views of integrated circuit device 10 in an X-Y plane, FIGS. 2B-5B are diagrammatic cross-sectional views of integrated circuit device 10 in an X-Z plane along line B-B respectively of FIGS. 2A-5A, FIGS. 2C-5C are diagrammatic cross-sectional views of integrated circuit device 10 in a Y-Z plane along line C-C respectively of FIGS. 2A-5A, and FIGS. 2D-5D are diagrammatic cross-sectional views of integrated circuit device 10 in a Y-Z plane along line D-D respectively of FIGS. 2A-5A. Integrated circuit device 10 may be included in a microprocessor, a memory, and/or other integrated circuit device. In some implementations, integrated circuit device 10 may be a portion of an IC chip, a system on chip (SoC), or portion thereof, that includes various passive and active microelectronic devices such as resistors, capacitors, inductors, diodes, p-type FETs (PFETs), n-type FETs (NFETs), metal-oxide-semiconductor FETs (MOSFETs), complementary MOS (CMOS) transistors, bipolar junction transistors (BJTs), laterally diffused MOS (LDMOS) transistors, high voltage transistors, high frequency transistors, other suitable components, or combinations thereof. The various transistors may be planar transistors or multi-gate transistors, such as FinFETs, depending on design requirements of integrated circuit device 10. FIGS. 2A-5A, FIGS. 2B-5B, FIGS. 2C-5C and FIGS. 2C-5D have been simplified for the sake of clarity to better understand the inventive concepts of the present disclosure. Additional features can be added in integrated circuit device 10, and some of the features described below can be replaced, modified, or eliminated in other embodiments of integrated circuit device 10.

Turning to FIGS. 2A-2D, integrated circuit device 10 includes a substrate (wafer) 12. In the depicted embodiment, substrate 12 is a semiconductor substrate, including, for example, silicon. Alternatively or additionally, substrate 12 includes another elementary semiconductor, such as germanium; a compound semiconductor, such as silicon carbide, gallium arsenide, gallium phosphide, indium phosphide, indium arsenide, and/or indium antimonide; an alloy semiconductor, such as SiGe, GaAsP, AlInAs, AlGaAs, GaInAs, GaInP, and/or GaInAsP; or combinations thereof. Alternatively, substrate 12 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In some implementations, substrate 12 includes one or more group III-V materials and/or one or more group II-IV materials.

Substrate 12 includes various doped regions, such as a doped region 14 and a doped region 16, configured according to design requirements of integrated circuit device 10. In some implementations, substrate 12 includes p-type doped regions (for example, p-type wells) doped with p-type dopants, such as boron (for example, $BF_2$), indium, other p-type dopant, or combinations thereof. In some implementations, substrate 12 includes n-type doped regions (for example, n-type wells) doped with n-type dopants, such as phosphorus, arsenic, other n-type dopant, or combinations thereof. In some implementations, substrate 12 includes doped regions formed with a combination of p-type dopants and n-type dopants. In the depicted embodiment, doped region 14 and/or doped region 16 are configured for a p-type metal-oxide-semiconductor (PMOS) FinFET or an n-type MOS (NMOS) FinFET. For example, doped region 14 and/or doped region 16 is an n-type doped region, a p-type doped region, or a combination thereof. The various doped regions can be formed directly on and/or in substrate 12, for example, providing a p-well structure, an n-well structure, a dual-well structure, a raised structure, or combinations thereof. An ion implantation process, a diffusion process, and/or other suitable doping process can be performed to form the various doped regions.

Integrated circuit device 10 includes a fin 20A, a fin 20B, a fin 20C, and fin 20D (also referred to as fin structures or active fin regions) disposed over substrate 12. Fins 20A-20D are oriented substantially parallel to one another, each having a length defined in an x-direction, a width defined in a y-direction, and a height defined in a z-direction. The present disclosure contemplates variations in height, width, and length of fins 20A-20D that may arise from processing and fabrication. For example, in FIGS. 2A-2C, a width of fins 20A-20D varies from an upper portion of fins 20A-20D to a lower portion of fins 20A-20D. In the depicted embodiment, the width tapers from the upper portion of fins 20A-20D to the lower portion of fins 20A-20D, such that an average width of the upper portion is less than an average width of the lower portion. In some implementations, the width can vary from about 5 nm to about 15 nm along fins 20A-20D depending on where the width is measured along the height of fins 20A-20D. In some implementations, a width of fins 20A-20D varies depending on a position of fins 20A-20D relative to one another and/or relative to other features of integrated circuit device 10. For example, a width of center fins may be greater than a width of edge fins. In another example, alternatively, a width of center fins is less than a width of edge fins. In both such implementations, the width of edge fins can represent an average width of edge fins, and the width of center fins can represent an average width of center fins. In some implementations, a width of fins of a FinFET of integrated circuit device 10 (including, for example, fins 20A, 20B) is different than a width of fins of another FinFET of integrated circuit device 10 (including, for example, fins 20C, 20D). In some implementations, the widths are not tapered, such that fins 20A-20D have substantially the same width along their height.

Fins 20A-20D each have at least one channel region, at least one source region, and at least one drain region defined along their length in the x-direction, where a channel region is disposed between a source region and a drain region (generally referred to as source/drain regions). Channel regions include a top portion defined between sidewall portions, where the top portion and the sidewall portions engage with a gate structure (as described below), such that current can flow between the source/drain regions during operation. The source/drain regions also include top portions defined between sidewall portions. In some implementations, fins 20A-20D are a portion of substrate 12 (such as a portion of a material layer of substrate 12). For example, where substrate 12 includes silicon, fins 20A-20D include silicon. Alternatively, in some implementations, fins 20A-20D are defined in a material layer, such as one or more semiconductor material layers, overlying substrate 12. For example, fins 20A-20D can include a semiconductor layer stack having various semiconductor layers (such as a heterostructure) disposed over substrate 12. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations depending on design requirements of integrated circuit device 10. In some implementations, the semiconductor layer stack includes alternating semiconductor layers, such as semiconductor layers composed of a first material and semiconductor layers composed of a second material. For example, the semiconductor layer stack alternates silicon layers and silicon germanium layers (for example, SiGe/Si/SiGe/Si/SiGe/Si from bottom to top). In some implementations, the semiconductor layer stack includes semiconductor layers of the same material but with alternating constituent atomic percentages, such as semiconductor layers having a constituent of a first atomic percent and semiconductor layers having the constituent of a second atomic percent. For example, the semiconductor layer stack includes silicon germanium layers having alternating silicon and/or germanium atomic percentages (for example, $Si_aGe_b/Si_cGe_d/Si_aGe_b/Si_cGe_d/Si_aGe_b/Si_cGe_d$ from bottom to top, where a, c are different atomic percentages of silicon and b, d are different atomic percentages of germanium).

Fins 20A-20D are formed over substrate 12 by any suitable process. In some implementations, a combination of deposition, lithography and/or etching processes are performed to define fins 20A-20D extending from substrate 12 as illustrated in FIGS. 2A-2D. For example, forming fins 20A-20D includes performing a lithography process to form a patterned resist layer over substrate 12 (or a material layer, such as a heterostructure, disposed over substrate 12) and performing an etching process to transfer a pattern defined in the patterned resist layer to substrate 12 (or the material layer, such as the heterostructure, disposed over substrate 12). The lithography process can include forming a resist layer on substrate 12 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of substrate 12 (or a material layer disposed over substrate 12). The etching process can include a dry etching process (for example, a reactive ion etching (RIE) process), a wet etching process, other suitable etching process, or combinations thereof. After the etching process, the patterned resist layer is removed from substrate 12, for example, by a resist stripping process. Alternatively, fins 20A-20D are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some implementations, directed self-assembly (DSA) techniques are implemented while forming fins 20A-20D. Further, in some implementations, the exposure process can implement maskless lithography, electron-beam (e-beam) writing, ion-beam writing, and/or nanoimprint technology for patterning the resist layer and/or other layers.

An isolation feature(s) 22 is formed over and/or in substrate 12 to isolate various regions, such as various device regions, of integrated circuit device 10. For example, isolation feature 22 separates and isolates active device regions and/or passive device regions from each other, such as a FinFET of integrated circuit device 10 that includes fins 20A, 20B and a FinFET of integrated circuit device 10 that includes fins 20C, 20D. Isolation feature 22 further separates and isolates fins 20A-20D from one another. In the depicted embodiment, isolation feature 22 surrounds a bottom portion of fins 20A-20D. Isolation feature 22 includes silicon oxide, silicon nitride, silicon oxynitride, other suitable isolation material (for example, including silicon, oxygen, nitrogen, carbon, or other suitable isolation constituent), or combinations thereof. Isolation feature 22 can include different structures, such as shallow trench isolation (STI) structures, deep trench isolation (DTI) structures, and/or local oxidation of silicon (LOCOS) structures. In some implementations, STI features can be formed by etching a trench in substrate 12 (for example, by using a dry etch process and/or wet etch process) and filling the trench with insulator material (for example, by using a chemical vapor deposition process or a spin-on glass process). A chemical mechanical polishing (CMP) process may be performed to remove excessive insulator material and/or planarize a top surface of isolation feature 22. In some implementations, STI features can be formed by depositing an insulator material over substrate 12 after forming fins 20A-20D (in some implementations, such that the insulator material layer fills gaps (trenches) between fins 20A-20D) and etching back the insulator material layer to form isolation feature 22. In some implementations, isolation feature 22 includes a multi-layer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, isolation feature 22 includes a dielectric layer disposed over a doped liner layer (including, for example, boron silicate glass (BSG) or phosphosilicate glass (PSG)).

Various gate structures are disposed over fins 20A-20D, such as a gate structure 30A, a gate structure 30B, a gate structure 30C, and a gate structure 30D. Gate structures 30A-30D extend along the y-direction (for example, substantially perpendicular to fins 20A-20D). Gate structures 30A-30D are disposed over respective channel regions of fins 20A-20D, thereby interposing respective source/drain regions of fins 20A-20D. Gate structures 30A-30D can engage respective channel regions of fins 20A-20D, such that current can flow between respective source/drain regions of fins 20A-20D during operation. In some implementations, gate structures 30A-30D wrap respective channel regions of fins 20A-20D. Gate structures 30A-30D include gate stacks configured to achieve desired functionality according to design requirements of integrated circuit device 10, such that gate structures 30A-30D include the same or different layers and/or materials. Gate structures 30A-30D have gate stacks that include a gate dielectric 32 and a gate electrode 34. Gate dielectric 32 is conformally disposed over fins 20A-20D and isolation feature 22, such that gate dielectric 32 has a substantially uniform thickness. In the depicted embodiment, gate dielectric 32 is disposed on sidewall surfaces and bottom surfaces of integrated circuit device 10 defining gate structures 30A-30D. Gate dielectric 32 includes a dielectric material, such as silicon oxide, high-k dielectric material, other suitable dielectric material, or combinations thereof. In the depicted embodiment, gate dielectric 32 includes a high-k dielectric material (and thus may be referred to as a high-k dielectric layer), such as hafnium dioxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). In some implementations, gate dielectric 32 further includes an interfacial layer (including a dielectric material, such as silicon oxide) disposed between the high-k dielectric layer and fins 20A-20D and isolation feature 22.

Gate electrode 34 is disposed over gate dielectric 32. Gate electrode 34 includes an electrically conductive material. In the depicted embodiment, gate electrode 34 includes a capping layer 36, a work function layer (including, for example, a work function layer 38, a work function layer 40, a work function layer 42), a glue/barrier layer 44, and a metal fill (or bulk) layer 46. Capping layer 36 is conformally disposed over gate dielectric 32, such that capping layer 36 has a substantially uniform thickness. Capping layer 36 includes a material that prevents or eliminates diffusion and/or reaction of constituents between gate dielectric 32 and other layers of gate structures 30A-30D (in particular, gate layers including metal). In some implementation, capping layer 36 includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. For example, in the depicted embodiment, capping layer 36 includes titanium and nitrogen (for example, TiN). Work function layer 38 is conformally disposed over capping layer 36, work function layer 40 is conformally disposed over work function layer 40, and work function layer 42 is conformally disposed over work function layer 40, such that work function layers 38-42 have substantially uniform thicknesses. Work function layers 38-42 include a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. In the depicted embodiment, work function layer 38 includes a p-type work function material, including, for example, titanium and nitrogen, such as TiN; work function layer 40 includes a p-type work function material, including, for example, tantalum and nitrogen, such as TaN; and work function layer 42 includes an n-type work function material, including, for example, titanium and aluminum, such as TaAlC, TaAl, TiAlC, TiAl, TaSiAl, TiSiAl, TaAlN, or TiAlN. Glue/barrier layer 44 is conformally disposed over work function layer 42. Glue/barrier layer 44 includes a material that promotes adhesion between adjacent layers, such as work function layer 42 and metal fill layer 46, and/or a material that blocks and/or reduces diffusion between gate layers, such as work function layers 38-42 and metal fill layer 46. For example, glue/barrier layer 44 includes metal (for example, W, Al, Ta, Ti, Ni, Cu, Co, other suitable metal, or combinations thereof), metal oxides, metal nitrides, or combinations thereof. In the depicted embodiment, glue/barrier layer 44 includes titanium and nitrogen, such as TiN. Metal fill layer 46 is disposed over glue/barrier layer 44. Metal fill layer 46 includes a suitable conductive material, such as Al, W, and/or Cu. In the depicted embodiment, metal fill layer 46 includes W. Metal fill layer 46 may additionally or collectively include other metals, metal oxides, metal nitrides, other suitable materials, or combinations thereof. Gate dielectric 32 and/or gate electrode 34 may include numerous other layers, for example, capping layers, interface layers, diffusion layers, barrier layers, hard mask layers, or combinations thereof.

Gate stacks of gate structures 30A-30D are fabricated according to a gate last process, a gate first process, or a hybrid gate last/gate first process. In gate last process implementations, one or more of gate structures 30A-30D include dummy gate stacks that are subsequently replaced with metal gate stacks (generally referred to as a gate replacement process). The dummy gate stacks include, for example, an interfacial layer (including, for example, silicon oxide) and a dummy gate electrode layer (including, for example, polysilicon). In such implementations, the dummy gate electrode layer is removed to form openings (trenches) in which gate dielectric 32 and/or gate electrode 34 are subsequently formed. In some implementations, a dummy gate stack of at least one of gate structures 30A-30D is replaced with a metal gate stack, while a dummy gate stack of at least one of gate structures 30A-30D remains. Gate last processes and/or gate first processes can implement deposition processes, lithography processes, etching processes, other suitable processes, or combinations thereof. The deposition processes include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, e-beam writing, or ion-beam writing. The etching processes include dry etching processes, wet etching processes, other etching processes, or combinations thereof.

Gate structures 30A-30D further include respective gate spacers 50 disposed adjacent to (for example, along sidewalls of) the respective gate stacks. Gate spacers 50 are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 12 and subsequently anisotropically etched to form gate spacers 50. In some implementations, gate spacers 50 include a multi-layer structure, such as a first dielectric layer that includes silicon nitride and a second dielectric layer that includes silicon oxide. In some implementations, gate spacers 50 include more than one set of spacers, such as seal spacers, offset spacers, sacrificial spacers, dummy spacers, and/or main spacers, formed adjacent to the gate stacks. In such implementations, the various sets of spacers can include materials having different etch rates. For example, a first dielectric layer including silicon and oxygen can be deposited over substrate 12 and subsequently anisotropically etched to form a first spacer set adjacent to the gate stacks, and a second dielectric layer including silicon and nitrogen can be deposited over substrate 12 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features in fins 20A-20D before and/or after forming gate spacers 50.

Epitaxial source features and epitaxial drain features (referred to as epitaxial source/drain features) are disposed over the source/drain regions of fins 20A-20D. For example, semiconductor material is epitaxially grown on fins 20A-20D, forming epitaxial source/drain features 60A-60F. In some implementations, epitaxial source/drain features 60A-60F are formed over the source/drain regions of fins 20A-20D after a fin recess process (for example, an etch back process), such that epitaxial source/drain features 60A-60F are grown from recessed fins 20A-20D. In some implementations, epitaxial source/drain features 60A-60F wrap source/drain regions of fins 20A-20D. In such implementations, fins 20A-20D may not be subjected to a fin recess process. Epitaxial source/drain features 60A-60F extend (grow) laterally along the y-direction (in some implementations, substantially perpendicular to fins 20A-20D), such that epitaxial source/drain features 60A-60F are merged epitaxial source/drain features that span more than one fin (for example, epitaxial source/drain features 60A-60C span fins 20A, 20B and epitaxial source/drain features 60D-60F span fins 20C, 20D). An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of substrate 12. Epitaxial source/drain features 60A-60F are doped with n-type dopants and/or p-type dopants. In some implementations, one or more of epitaxial source/drain features 60A-60F are epitaxial layers including silicon and/or germanium, where the silicon germanium containing epitaxial layers are doped with boron, carbon, other p-type dopant, or combinations thereof (for example, forming a Si:Ge:B epitaxial layer). In some implementations, one or more of epitaxial source/drain features 60A-60F are epitaxial layers including silicon and/or carbon, where silicon-containing epitaxial layers or silicon-carbon-containing epitaxial layers are doped with phosphorous, arsenic, other n-type dopant, or combinations thereof (for example, forming a Si:P epitaxial layer or a Si:C:P epitaxial layer). In some implementations, epitaxial source/drain features 60A-60F include materials and/or dopants that achieve desired tensile stress and/or compressive stress in the channel regions. In some implementations, epitaxial source/drain features 60A-60F are doped during deposition by adding impurities to a source material of the epitaxy process. In some implementations, epitaxial source/drain features 60A-60F are doped by an ion implantation process subsequent to a deposition process. In some implementations, annealing processes are performed to activate dopants in epitaxial source/drain features 60A-60F and/or other source/drain regions of integrated circuit device 10, such as HDD regions and/or LDD regions (both of which are not shown in FIGS. 2A-2D).

An interlevel dielectric (ILD) layer 70 is disposed over substrate 12, particularly over fins 20A-20D and gate structures 30A-30D. In some implementations, ILD layer 70 is a portion of a multilayer interconnect (MLI) feature that electrically couples various devices (for example, transistors, resistors, capacitors, and/or inductors) and/or components (for example, gate structures and/or source/drain features) of integrated circuit device 10, such that the various devices and/or components can operate as specified by design requirements of integrated circuit device 10. ILD layer 70 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In some implementations, ILD layer 70 has a multilayer structure having multiple dielectric materials. In some implementations, a contact etch stop layer (CESL) is disposed between ILD layer 70 and fins 20A-20D and/or gate structures 30A-30D. The CESL includes a material different than ILD layer 70, such as a dielectric material that is different than the dielectric material of ILD layer 70. In the depicted embodiment, where ILD layer 70 includes a low-k dielectric material, the CESL includes silicon and nitrogen (for example, silicon nitride or silicon oxynitride). ILD layer 70 and/or the CESL is formed over substrate 12, for example, by a deposition process (such as CVD, PVD, ALD, HDPCVD, MOCVD, RPCVD, PECVD, LPCVD, ALCVD, APCVD, plating, other suitable methods, or combinations thereof). In some implementations, ILD layers 70 and/or the CESL are formed by a flowable CVD (FCVD) process that includes, for example, depositing a flowable material (such as a liquid compound) over substrate 12 and converting the flowable material to a solid material by a suitable technique, such as thermal annealing and/or ultraviolet radiation treating. Subsequent to the deposition of ILD layer 70 and/or the CESL, a CMP process and/or other planarization process is performed, such that a top portion of gate structures 30A-30D is reached (exposed).

Turning to FIGS. 3A-3D, a patterning layer 100 is formed over integrated circuit device 10 (in particular, over gate structures 30A-30D and ILD layer 70), where patterning layer 100 includes an opening 110 that exposes a portion of at least one of gate structures 30A-30D. Patterning layer 100 is used to remove (or cut) a portion of at least one of gate structures 30A-30D, separating the at least one of gate structures 30A-30D into more than one gate structure. Patterning layer 100 is thus alternatively referred to as a gate cut mask. In the depicted embodiment, opening 110 (also referred to as a gate cut window or a gate cut region) has a dimension X that extends in a direction substantially parallel to fins 20A-20D (here, in the x-direction) and a dimension Y that extends in a direction substantially parallel to gate structures 30A-30D (here, in the y-direction), such that opening 110 exposes a portion of gate structure 30B and a portion of gate structure 30C to be removed without exposing gate structure 30A and gate structure 30D. In furtherance of the depicted embodiment, X is configured such that opening 110 exposes an entire width of gate structure 30B, an entire width of gate structure 30C, a portion of ILD layer 70 disposed between gate structure 30B and gate structure 30C, a portion of ILD layer 70 disposed between gate structure 30B and gate structure 30A, and a portion of ILD layer 70 disposed between gate structure 30C and gate structure 30D (FIG. 3A, FIG. 3B); and Y is configured such that opening 110 is large enough to effectively remove portions of gate structures 30B, 30C disposed between active regions of integrated circuit device 10 (FIG. 3D) (for example, portions of gate structure 30B, 30C disposed between a first active fin region (fins 20A, 20B) and a second active fin region (fins 20C, 20D)), yet small enough to ensure that other features of integrated circuit device 10, such as epitaxial source/drain features 60B, 60E, are not exposed (FIG. 3C) to an etching process used to remove the exposed portions of gate structures 30B, 30C. Opening 110 thus does not expose epitaxial source/drain features 60A-60F.

Patterning layer 100 includes a material that is different than a material of gate structures 30A-30D (in particular, a material of gate spacers 50, a material of gate electrode 34, and a material of gate dielectric 32) and ILD layer 70 to achieve etching selectivity during subsequent etching processes. In some implementations, patterning layer 100 includes silicon, amorphous silicon, semiconductor oxide (for example, silicon oxide ($SiO_2$)), semiconductor nitride (for example, silicon nitride (SiN)), semiconductor oxynitride (for example, silicon oxynitride (SiON)), and/or semiconductor carbide (for example, silicon carbide (SiC)), other semiconductor material, and/or other dielectric material. In some implementations, patterning layer 100 includes a resist material (and thus may be referred to as a patterned resist layer and/or a patterned photoresist layer). In some implementations, patterning layer 100 has a multi-layer structure. For example, in the depicted embodiment, patterning layer 100 includes a mask barrier layer 102 disposed over gate structures 30A-30D and ILD layer 70, and a mask layer 104 disposed over mask barrier layer 102. Mask barrier layer 102 includes a material with high etch resistance that achieves desired etching selectivity (for example, between mask barrier layer 102 and mask layer 104), such as a material including titanium and nitrogen (for example, TiN), and mask layer 104 includes a material that achieves desired etching selectivity (for example, between mask layer 104 and ILD 70, gate spacers 50, gate electrode 34, and gate dielectric 32), such as a dielectric material that includes silicon and nitrogen (for example, SiN).

Patterning layer 100 is formed by deposition processes, lithography processes, and/or etching processes. For example, mask barrier layer 102 and mask layer 104 are deposited over integrated circuit device 10 by CVD, PVD, ALD, HDPCVD, MOCVD, RPCVD, PECVD, LPCVD, ALCVD, APCVD, plating, other suitable deposition process, or combinations thereof. Opening 110 is then formed by performing a lithography process to form a patterned resist layer over mask layer 104 and performing an etching process to transfer a pattern defined in the patterned resist layer to mask layer 104. The lithography process can include forming a resist layer on mask layer 104 (for example, by spin coating), performing a pre-exposure baking process, performing an exposure process using a mask, performing a post-exposure baking process, and performing a developing process. During the exposure process, the resist layer is exposed to radiation energy (such as UV light, DUV light, or EUV light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of mask layer 104 and/or mask barrier layer 102. The etching process can include a dry etching process, a wet etching process, other suitable etching process, or combinations thereof. After the etching process, the patterned resist layer is removed from mask layer 104, for example, by a resist stripping process. In some implementations, the patterned resist layer is used as an etch mask to remove portions of mask layer 104 and mask barrier layer 102. In some implementations, the patterned resist layer is used as an etch mask to remove portions of mask layer 104, and then mask layer 104 is used as an etching mask to remove portions of mask barrier layer 102. Various selective etching processes can be performed. Alternatively, the exposure process can be implemented or replaced by other methods, such as maskless lithography, e-beam writing, ion-beam writing, and/or nanoimprint technology.

Figure 4A:
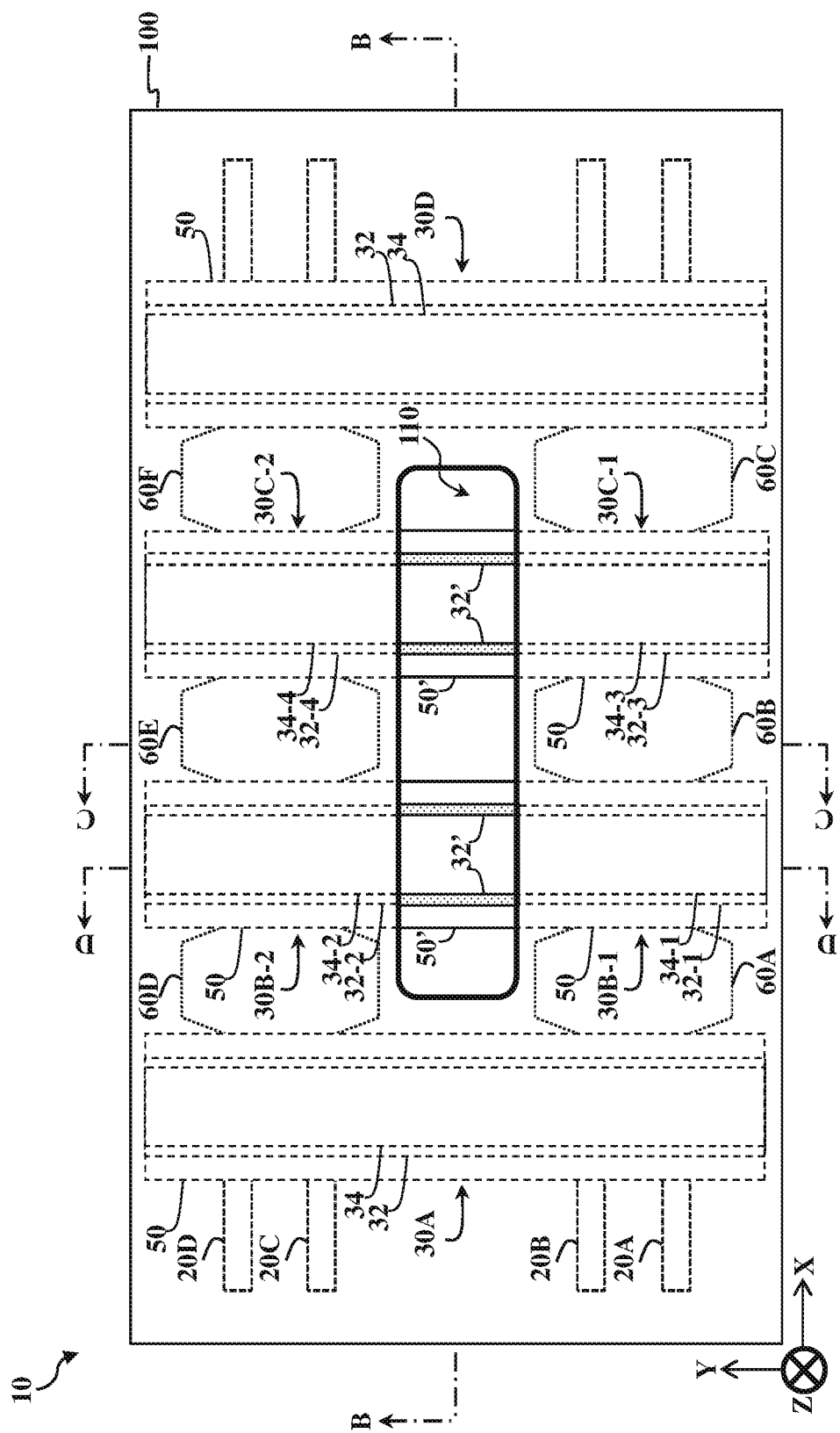
Figure 4B:
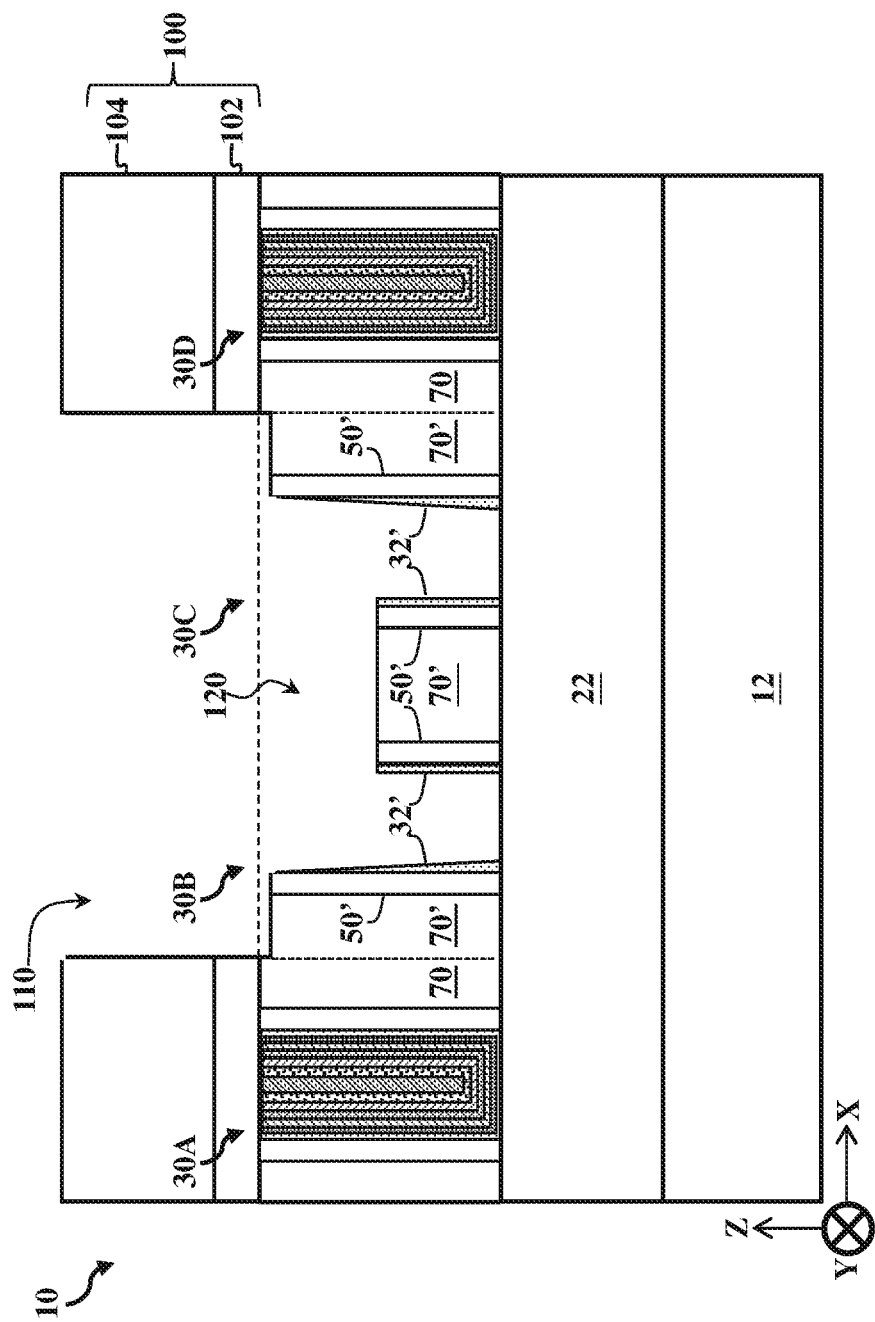
Figure 4C:
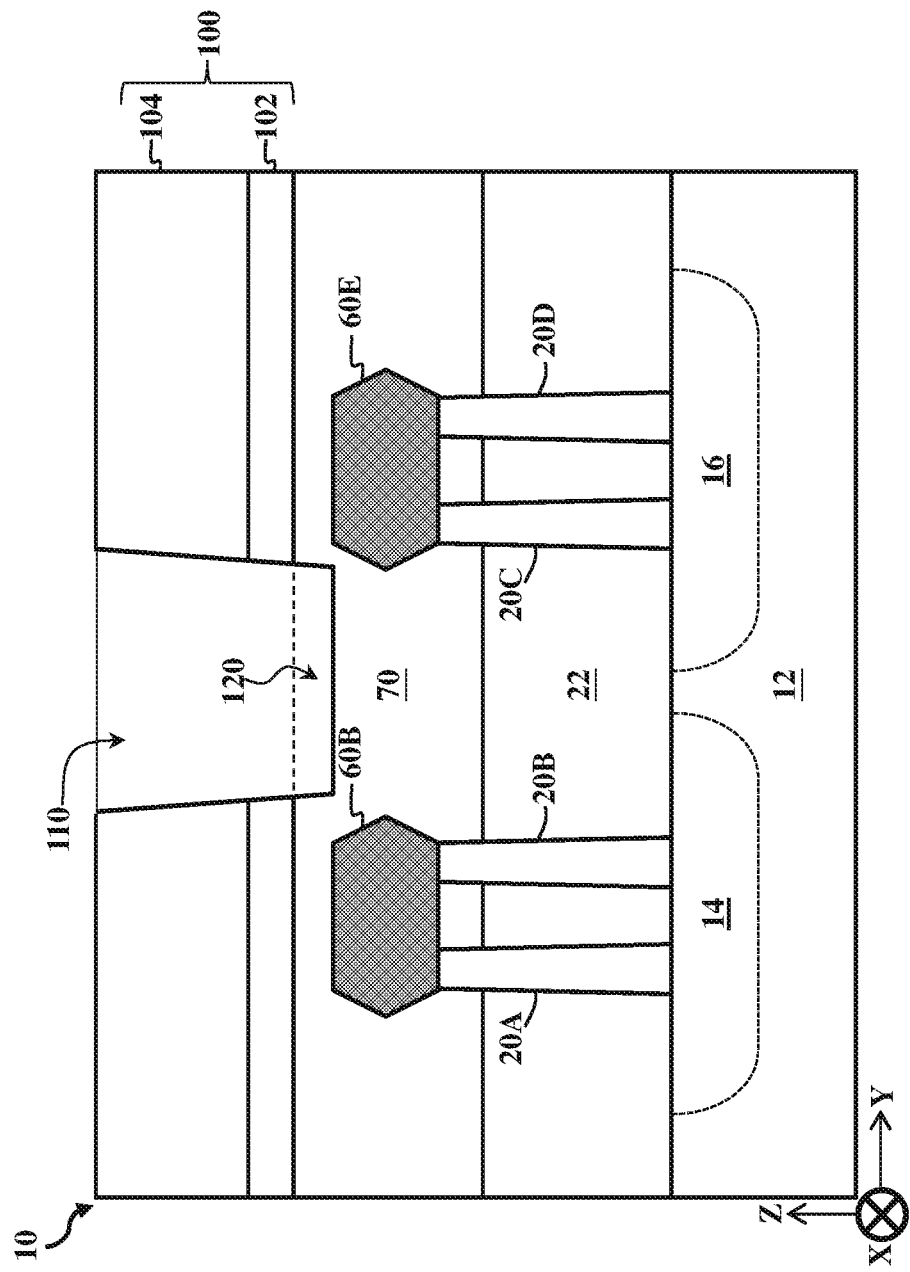
Figure 4D:
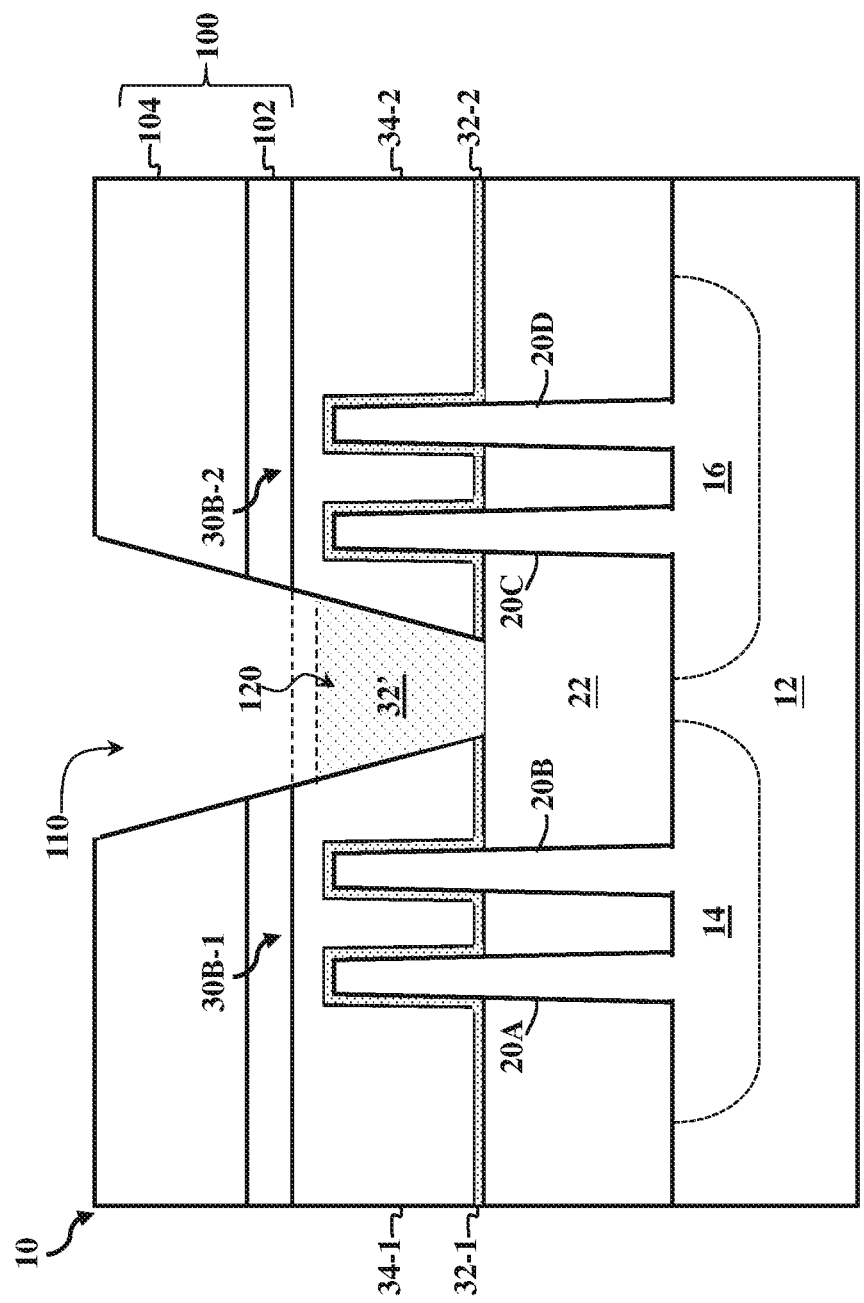

Turning to FIGS. 4A-4D, portions of gate structures 30A-30D exposed by opening 110 are selectively removed to divide at least one of gate structures 30A-30D into more than one gate structure. For example, an etching process is performed that selectively etches a gate electrode of the exposed portion of the gate structure without (or minimally) etching a gate dielectric of the exposed portion of the gate structure. In the depicted embodiment, gate electrode 34 is selectively etched from the exposed portion of gate structure 30B and the exposed portion of gate structure 30C relative to gate dielectric 32, gate spacers 50, and ILD layer 70, thereby forming a gate opening 120 that separates gate structure 30B into a gate structure 30B-1 and a gate structure 30B-2 and gate structure 30C into a gate structure 30C-1 and a gate structure 30C-2. As shown in FIG. 4D, gate structure 30B-1 includes a respective gate electrode 34-1 and a respective gate dielectric 32-1, and gate structure 30B-2 includes a respective gate electrode 34-2 and a respective gate dielectric 32-2. Gate structure 30C-1 and gate structure 30C-2 also include respective gate dielectrics 32-3, 32-4 and respective gate electrodes 34-3, 34-4. The etching process completely (or substantially) removes exposed gate electrode 34 without substantially removing exposed gate dielectric 32, leaving a residual gate dielectric 32' in gate opening 120. In FIG. 4A and FIG. 4B, the etching process completely (or substantially) removes gate dielectric 32 from bottom surfaces defining gate opening 120 while minimally removing gate dielectric 32 from sidewall surfaces defining gate opening 120. For example, residual gate dielectric 32' remains on residual gate spacers 50' but not on isolation feature 22, such that residual gate dielectric 32' defines sidewalls of gate opening 120 but not a bottom of gate opening 120 (here, a top surface of isolation feature 22 defines the bottom of gate opening 120). Residual gate dielectric 32' extends between gate structure 30B-1 and gate structure 30B-2 and between gate structure 30C-1 and gate structure 30C-2. In FIG. 4A, gate structure 30B-1 (in particular, gate dielectric 32-1) is physically connected to gate structure 30B-2 (in particular, gate dielectric 32-2) via residual gate dielectric 32', and gate structure 30C-1 (in particular, gate dielectric 32-3) is physically connected to gate structure 30C-2 (in particular, gate dielectric 32-4) via residual gate dielectric 32'. In the depicted embodiment, a thickness of residual gate dielectric 32' is less than gate dielectric 32 before the etching process, though the present disclosure contemplates embodiments where the thickness of residual gate dielectric 32' is about the same as the thickness of gate dielectric 32 before the etching process. In some implementations, residual gate dielectric 32' has a tapered thickness (for example, a thickness that decreases along its height (here, in the z-direction)). In some implementations, the etching process is further configured to minimize removal of exposed gate spacers 50 and/or exposed ILD layer 70, leaving residual gate spacers 50' and residual ILD layer 70' in gate opening 120. In some implementations, a height of residual gate spacers 50' is less than a height of gate spacers 50 covered by patterning layer 100, and a height of residual ILD layer 70' is less than a height of ILD layer 70 covered by patterning layer 100. In some implementations, residual gate spacers 50' and/or residual ILD layer 70' have tapered thicknesses (for example, thicknesses that decrease along their respective heights).

Conventional gate cutting processes implement etching processes configured for low etching selectivity between gate electrode 34 and gate dielectric 32 (for example, an etch selectivity of about 1:1), such that gate electrode 34 and gate dielectric 32 are both completely (or substantially) removed during the etching process. However, lateral etching arising from such etching processes (for example, in the x-direction and the y-direction) has been observed to damage epitaxial source/drain features, such as epitaxial source/drain features 60A-60F, of integrated circuit devices. To prevent (or minimize) these lateral etching effects, the disclosed etching process is configured for high etching selectivity to gate electrode 34, leaving residual gate dielectric 32' to function as a barrier layer (or a protection layer) for epitaxial source/drain features 60A-60F during the etching process. Residual gate dielectric 32' prevents (or minimizes) lateral etching of gate spacers 50 and/or ILD layer 70, ensuring that epitaxial source/drain features 60A-60F are not exposed to the etching process and/or damaged by the etching process. For example, in FIG. 4C, residual gate dielectric 32' can minimize etching of ILD layer 70 in the y-direction, ensuring that epitaxial source/drain features 60B, 60E are not etched as gate opening 120 extends into ILD layer 170 along the z-direction Eliminating (or minimizing) damage to epitaxial source/drain features 60A-60F increases IC manufacturing yield and IC device reliability and/or performance. Different embodiments may have different advantages, and no particular advantage is necessarily required of any embodiment.

The etching process exhibits a high etching selectivity to gate electrode 34. In some implementations, the etching process is configured to achieve an etching rate of gate electrode 34 that is greater than an etching rate of gate dielectric 32. The etching rate of gate electrode 34 can be about 2 nanometers/minute (nm/min) to about 30 nm/min. The etching rate of gate dielectric 32 can be about −5 nm/min to about 15 nm/min. The etching process is a dry etching process, a wet etching process, or a combination thereof. In some implementations, a dry etching process implements fluorine-containing gas (for example, $CF_4$, $SF_6$, $CH_2F_2$, $CHF_3$, and/or $C_2F_6$), chlorine-containing gas (for example, $Cl_2$, $CHCl_3$, $CCl_4$, and/or $BCl_3$), bromine-containing gas (for example, HBr and/or $CHBr_3$), iodine-containing gas, other suitable gases and/or plasmas, and/or combinations thereof. In the depicted embodiment, a chlorine-based etching chemistry is implemented to selectively etch gate electrode 34 relative to gate dielectric 32, gate spacers 50, and ILD 70. In some implementations, a ratio of a chlorine-containing etchant and/or other etchant of the chlorine-based etching chemistry is tuned throughout the etching process to achieve desired etching selectivity between the various layers of gate electrode 34 (here, capping layer 36, work function layer 38, work function layer 40, work function layer 42, glue/barrier layer 44, and metal fill layer 46) and gate dielectric 32. In some implementations, a wet etching process uses an etching solution that includes ammonium hydroxide ($NH_4OH$), hydrogen peroxide ($H_2O_2$), sulfuric acid ($H_2SO_4$), tetramethylammonium hydroxide (TMAH), hydrogen chloride (HCl), other suitable wet etching solution, or combinations thereof. For example, the wet etching solution utilizes an $NH_4OH:H_2O_2$ solution, an $HCl:H_2O_2$:$H_2O$ solution (known as an hydrochloric-peroxide mixture (HPM)), an $NH_4OH:H_2O_2:H_2O$ solution (known as an ammonia-peroxide mixture (APM)), or an $H_2SO_4:H_2O_2$ solution (known as a sulfuric peroxide mixture (SPM)). Various etching parameters can be tuned to selectively etch gate electrode 34, such as etchant composition, etching temperature, etching solution concentration, etching time, etching pressure, source power, RF bias voltage, RF bias power, etchant flow rate, other suitable etching parameters, or combinations thereof. In some implementations, an etching time of the etching process is tuned to etch gate electrode 34 and stop during etching of gate dielectric 32, thereby achieving selective etching of gate electrode 34. Thereafter, patterning layer 100 is removed, for example, by an etching process or a CMP process.

Figure 5A:
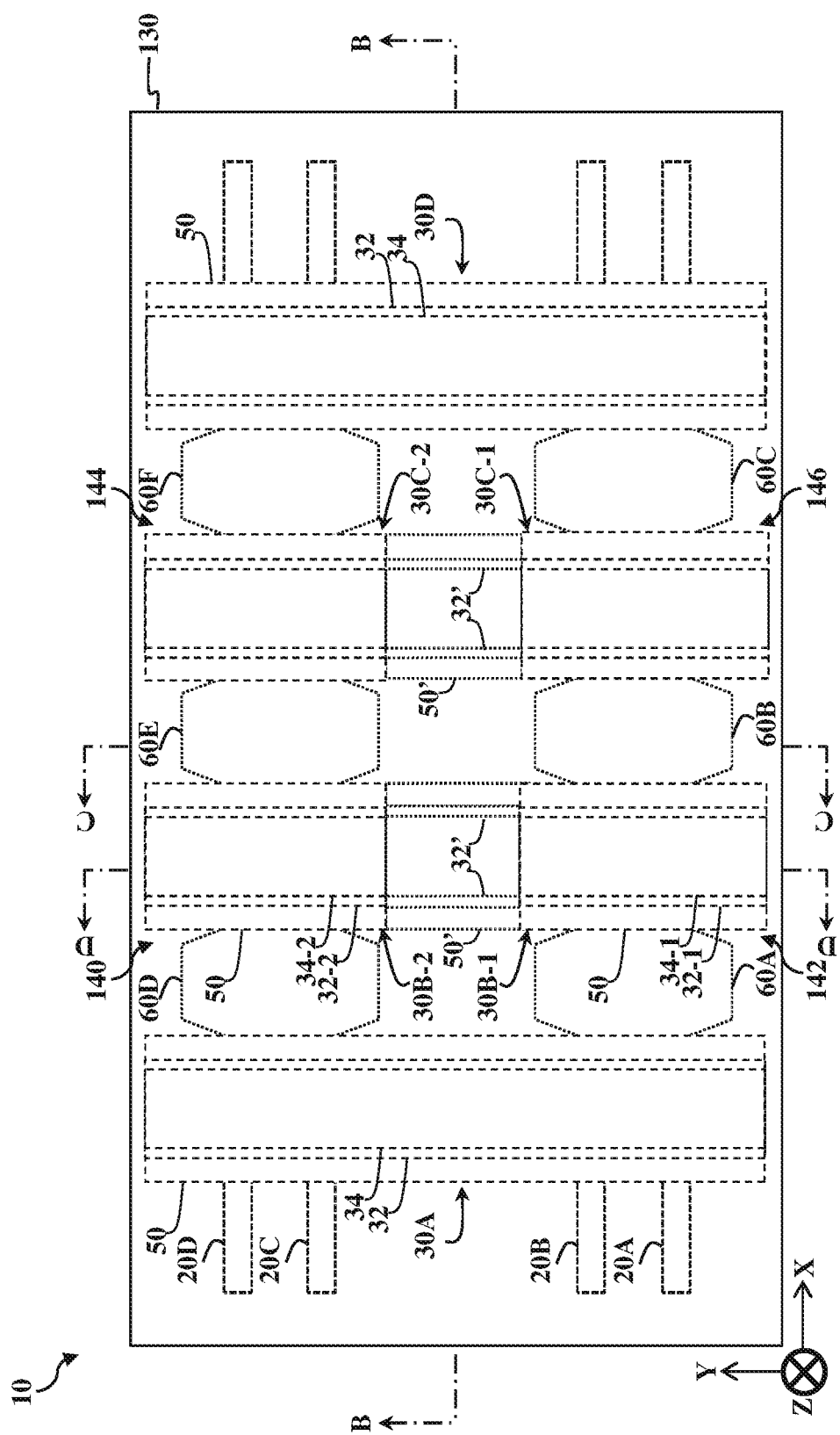
Figure 5B:
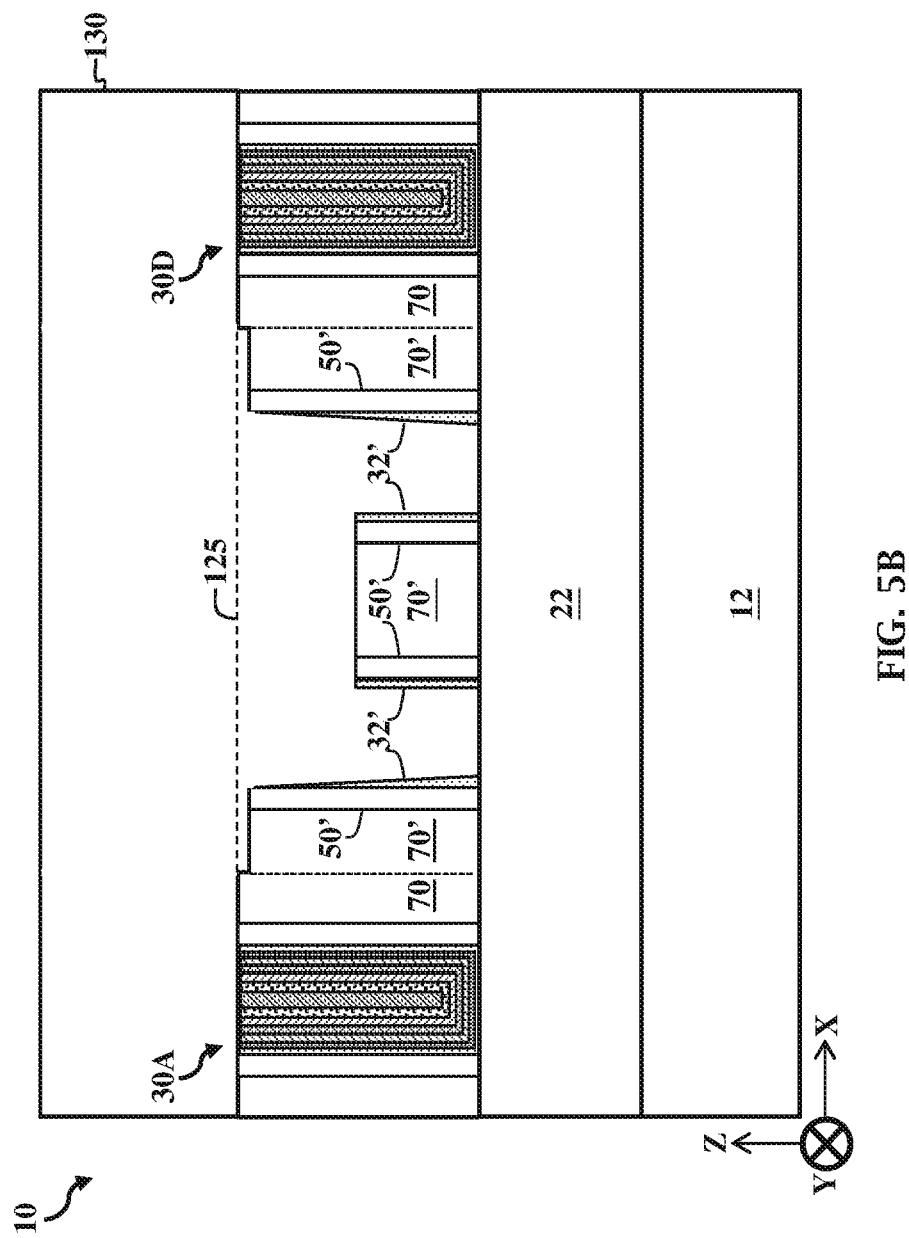
Figure 5C:
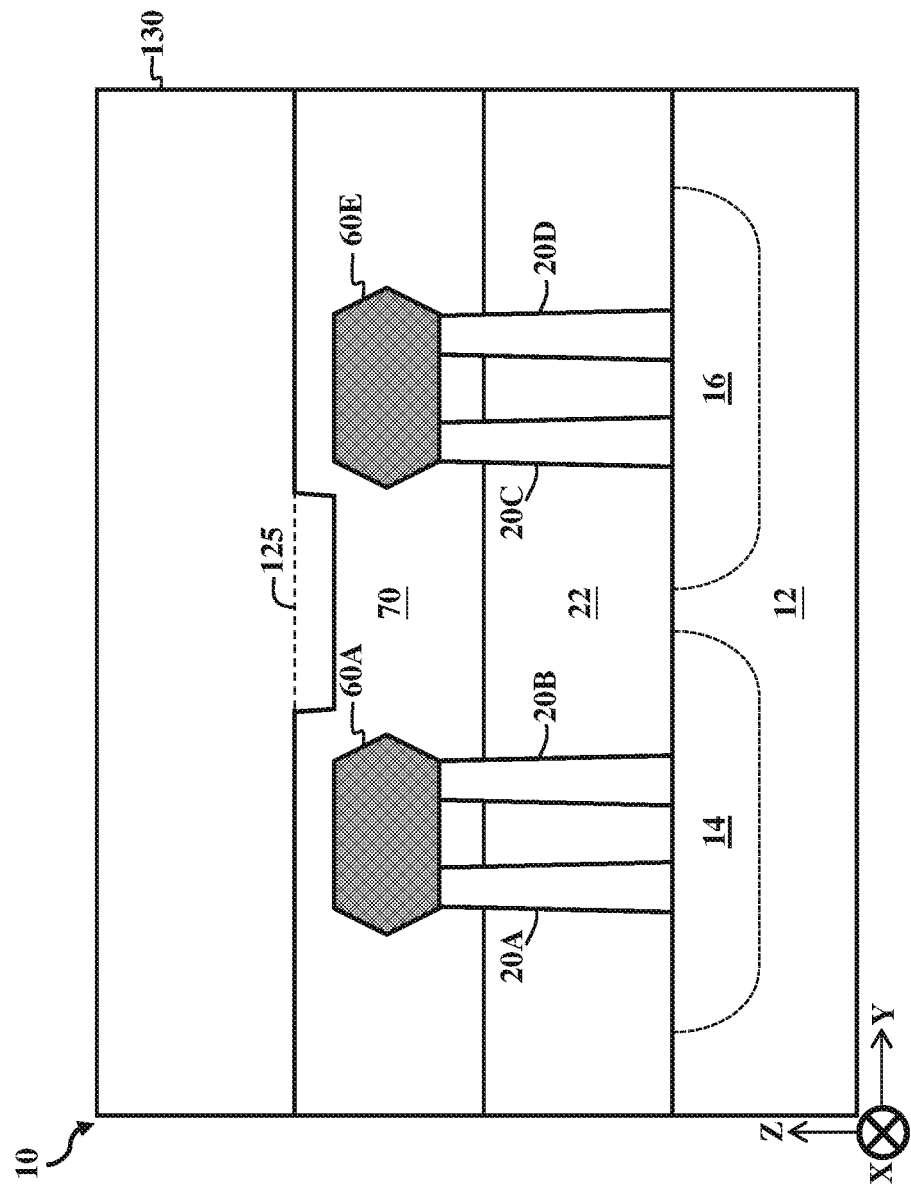
Figure 5D:
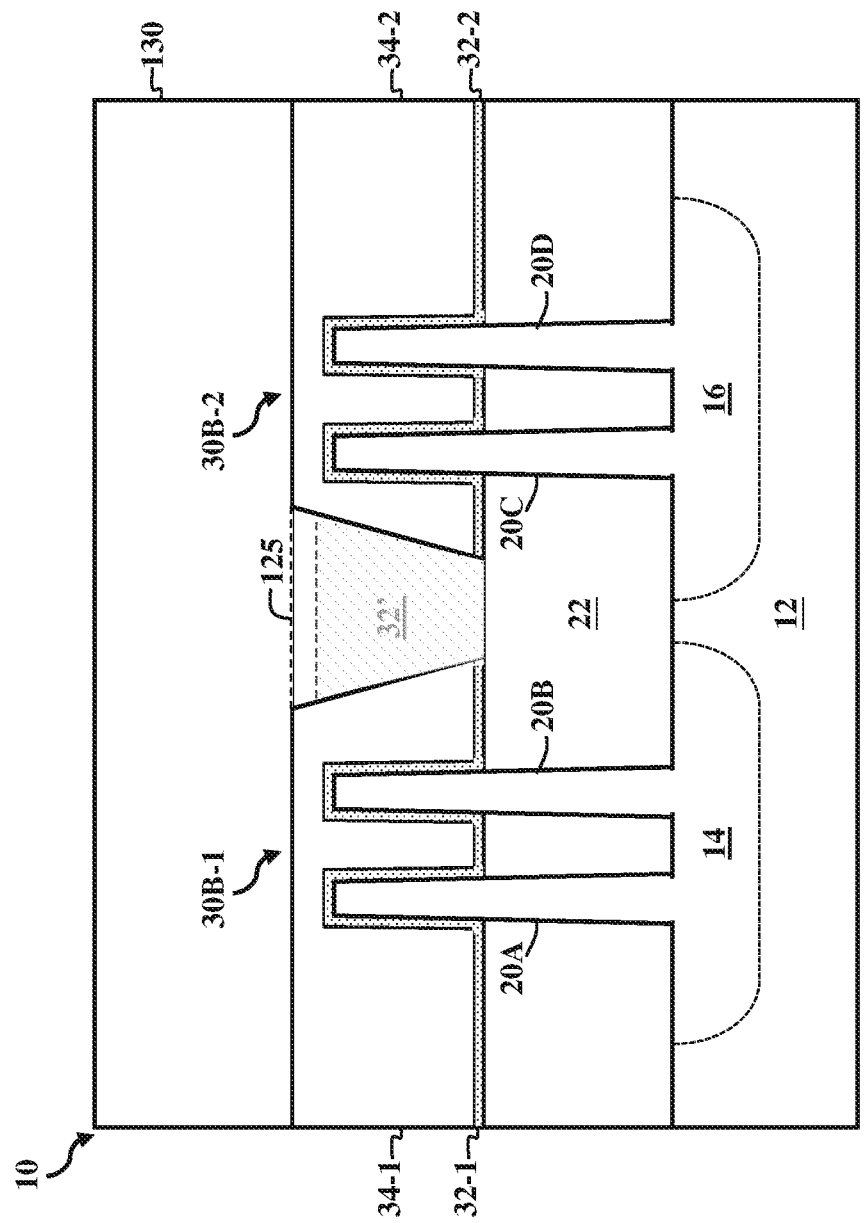

Turning to FIGS. 5A-5D, a gate isolation region 125 is formed in gate opening 120. In the depicted embodiment, gate isolation region 125 is disposed between gate structure 30B-1 and gate structure 30B-2 and between gate structure 30C-1 and gate structure 30C-2. Gate isolation region 125 includes a dielectric material. For example, an ILD layer 130 is formed over integrated circuit device 10, particularly over gate structures 30A-30D and ILD layer 70. A portion of ILD layer 130 forms the gate isolation region 125. For example, in FIG. 5A and FIG. 5B, a portion of ILD layer 130 extends through ILD layer 70 to isolation feature 22, such that residual gate dielectric 32' is disposed between ILD layer 130 and residual gate spacers 50'. The portion of ILD layer 130 is disposed over residual gate spacers 50' and residual ILD layer 70'. In FIG. 5C, the portion of ILD layer 130 extends partially through ILD layer 70. In FIG. 5D, the portion of ILD layer 130 is disposed between gate structure 30B-1 and gate structure 30B-2, isolating gate structure 30B-1 from gate structure 30B-2. The portion of ILD layer 130 is further disposed between gate structure 30C-1 and gate structure 30C-2, isolating gate structure 30C-1 from gate structure 30C-2. In some implementations, after the gate cutting process, integrated circuit device 10 includes a FinFET 140 corresponding with gate structure 30B-1 and epitaxial source/drain features 60D, 60E; a FinFET 142 corresponding with gate structure 30B-2 and epitaxial source/drain features 60A, 60B; a FinFET 144 corresponding with gate structure 30C-1 and epitaxial source/drain features 60B, 60C; and a FinFET 146 corresponding with gate structure 30C-2 and epitaxial source/drain features 60E, 60F. Residual gate dielectric 32' extends between FinFET 140 and FinFET 142, and residual gate dielectric 32' extends between FinFET 144 and FinFET 146. In some implementations, residual gate dielectric 32' is physically connected to the gate dielectrics of FinFETs 140-146. FinFETs 140-146 are multi-fin FinFETS (in particular, FinFET 140 and FinFET 144 include fin 20C and fin 20D, and FinFET 142 and FinFET 146 include fin 20A and fin 20B), though the present disclosure contemplates embodiments where FinFETs 140-146 include more or less fins.

In some implementations, ILD layer 130 is a portion of the MLI feature that electrically couples various devices and/or components of integrated circuit device 10, such that the various devices and/or components can operate as specified by design requirements of integrated circuit device 10. ILD layer 130 is similar to ILD layer 70. For example, ILD layer 130 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In some implementations, ILD layer 130 has a multilayer structure having multiple dielectric materials. In some implementations, a CESL is disposed between ILD layer 130 and gate structures 30A-30D (including residual features of gate structures 30B, 30C) and/or ILD 70. The CESL includes a material different than ILD layer 130, such as a dielectric material that is different than the dielectric material of ILD layer 130. In the depicted embodiment, where ILD layer 130 includes a low-k dielectric material, the CESL includes silicon and nitrogen (for example, silicon nitride or silicon oxynitride). ILD layer 130 and/or the CESL are formed over substrate 12, for example, by a deposition process (such as CVD, PVD, ALD, HDPCVD, MOCVD, RPCVD, PECVD, LPCVD, ALCVD, APCVD, plating, other suitable methods, or combinations thereof). In some implementations, ILD layer 130 and/or the CESL are formed by a FCVD process as described above. Subsequent to the deposition of ILD layer 130 and/or the CESL, a CMP process and/or other planarization process is performed, such that a top surface of ILD layer 130 is substantially planar for subsequent processing.

Fabrication can proceed to complete fabrication of integrated circuit device 10. For example, various contacts can be formed to facilitate operation of integrated circuit device 10. For example, one or more ILD layers, similar to ILD layer 130 and/or ILD layer 70, can be formed over substrate 12 (in particular, over ILD layer 130). Contacts can then be formed in ILD layer 130, ILD layer 70, and/or ILD layers disposed over ILD layer 130. For example, contacts are respectively electrically coupled with at least one of gate structures 30A, 30B-1, 30B-2, 30C-1, 30C-2, and 30D (particularly, the gate electrode), and contacts are respectively electrically coupled to at least one source/drain region (particularly, at least one of epitaxial source/drain features 60A-60F). Contacts include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. In some implementations, ILD layers disposed over ILD layer 130 and the contacts (for example, extending through ILD layer 130, ILD layer 70, and/or the other ILD layers) are a portion of the MLI feature disposed over substrate 12, as described above. The MLI feature can include a combination of metal layers and ILD layers configured to form vertical interconnect features, such as contacts and/or vias, and/or horizontal interconnect features, such as lines. The various conductive features include materials similar to the contacts. In some implementations, a damascene process and/or dual damascene process is used to form the MLI feature.

The present disclosure provides for many different embodiments. Gate cutting techniques for integrated circuit devices, particularly for fin-like field effect transistor devices, are disclosed herein. The gate cutting techniques and related gate structures disclosed herein may be implemented in any of a variety of device types. For example, aspects of the present disclosure may be implemented to form gate structures suitable for planar field-effect transistors (FETs), multi-gate transistors (planar or vertical), such as fin-like FET (FinFET) devices, gate-all-around (GAA) devices, omega-gate (Ω-gate) devices, or pi-gate (Π-gate) devices, as well as strained-semiconductor devices, silicon-on-insulator (SOI) devices, partially-depleted SOI devices, fully-depleted SOI devices, or other devices. The present disclosure contemplates that one of ordinary skill may recognize other integrated circuit devices that can benefit from the gate cutting techniques and/or gate structures described herein.

An exemplary method includes receiving an integrated circuit device that includes a gate structure and performing a gate cut process to separate the gate structure into a first gate structure and a second gate structure. The gate cut process includes selectively removing a portion of the gate structure, such that a residual gate dielectric layer extends between the first gate structure and the second gate structure. In some implementations, the residual gate dielectric includes a high-k dielectric material. The method further includes forming a gate isolation region between the first gate structure and the second gate structure. In some implementations, the gate structure includes a gate electrode, a gate dielectric, and gate spacers, and the gate cut process selectively removes the gate electrode without completely removing the gate dielectric and the gate spacers, such that residual gate spacers also extend between the first gate structure and the second gate structure.

In some implementations, the performing the gate cut process includes forming a patterning layer over the integrated circuit device, wherein the patterning layer includes an opening that exposes a portion of the gate structure; and etching the portion of the gate structure exposed by the opening. In some implementations, the etching includes partially recessing a dielectric layer exposed by the opening. In some implementations, the selectively removing the portion of the gate structure includes using a chlorine-based etchant. In some implementations, the gate structure includes a multi-layer gate electrode disposed over a gate dielectric layer, the method further comprising tuning the chlorine-based etchant to selectively remove each layer of the multi-layer gate electrode without completely removing the gate dielectric layer. In some implementations, the integrated circuit device further includes a first interlevel dielectric (ILD) layer disposed over a substrate, such that the gate structure is disposed in the first ILD layer. In such implementations, the forming the gate isolation region includes forming a second ILD layer over the first ILD layer, wherein the second ILD layer fills an opening between the first gate structure and the second gate structure.

Another exemplary method includes receiving an integrated circuit device that includes a gate structure, wherein the gate structure includes a gate dielectric and a gate electrode; forming a patterning layer over the integrated circuit device, wherein the patterning layer includes an opening that exposes a portion of the gate structure; performing an etching process that selectively removes the gate electrode of the exposed portion of the gate structure without completely removing the gate dielectric of the exposed portion of the gate structure, thereby extending the opening through the gate structure; and filling the opening through the gate structure with a dielectric material. In some implementations, the gate dielectric includes a high-k dielectric material. In some implementations, the performing the etching process that selectively removes the gate electrode of the exposed portion of the gate structure includes forming a first gate structure of a first device and a second gate structure of a second device, wherein a first gate dielectric of the first gate structure is physically connected to a second gate dielectric of the second gate structure by the gate dielectric of the exposed portion of the gate structure remaining after the etching process. In some implementations, the etching process exposes the exposed portion of the gate structure to a chlorine-based etchant.

In some implementations, the etching process selectively removes the gate electrode of the exposed portion of the gate structure without completely removing a portion of an interlevel dielectric layer exposed by the opening. In some implementations, the etching process selectively removes the gate electrode of the exposed portion of the gate structure without completely removing gate spacers of the exposed portion of the gate structure. In some implementations, forming the patterning layer includes forming a titanium-and-nitrogen containing layer and a silicon-and-nitrogen containing layer over the integrated circuit device, and performing a lithography process to form the opening through the titanium-and-nitrogen containing layer and the silicon-and-nitrogen containing layer. In some implementations, the integrated circuit device further includes an interlevel dielectric (ILD) layer, wherein the gate structure is disposed in the ILD layer. In such implementations, the opening further exposes a portion of the ILD layer and the etching process selectively removes the gate electrode of the exposed portion of the gate structure without completely removing the exposed portion of the ILD layer. In some implementations, the filling the opening through the gate structure with the dielectric material includes forming an interlevel dielectric layer.

An exemplary integrated circuit device includes a first gate structure disposed between first source/drain features and a second gate structure disposed between second source/drain features. The first gate structure includes a first gate dielectric, a first gate electrode, and first spacers. The second gate structure includes a second gate dielectric, a second gate electrode, and second spacers. A residual gate dielectric layer extends between the first gate dielectric and the second gate dielectric. In some implementations, the residual gate dielectric layer is disposed between an interlevel dielectric (ILD) layer and a residual spacer. In some implementations, the ILD layer is disposed between the first gate structure and the second gate structure. In some implementations, the ILD layer is a first ILD layer, and the integrated circuit device further includes a second ILD layer disposed over the first gate structure, the first source/drain features, the second gate structure, and the second source/drain features, wherein the first ILD layer is further disposed over the second ILD layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device comprising:
   a first gate stack disposed between first source/drain features, wherein the first gate stack includes a first gate dielectric and a first gate electrode;
   a second gate stack disposed between second source/drain features, wherein the second gate stack includes a second gate dielectric and a second gate electrode; and
   a gate isolation feature disposed between and separating the first gate stack and the second gate stack, wherein the gate isolation feature includes:
   a residual gate dielectric that extends from the first gate dielectric to the second gate dielectric, and
   a dielectric layer disposed over the residual gate dielectric.

2. The integrated circuit device of claim 1, wherein:
   the residual gate dielectric includes a first residual gate dielectric layer that extends from the first gate dielectric to the second gate dielectric;
   the residual gate dielectric includes a second residual gate dielectric layer that extends from the first gate dielectric to the second gate dielectric; and
   the first residual gate dielectric layer is not connected to the second residual gate dielectric layer.

3. The integrated circuit device of claim 2, wherein:
   the first residual gate dielectric layer extends from a first sidewall portion of the first gate dielectric to a first sidewall portion of the second gate dielectric; and
   the second residual gate dielectric layer extends from a second sidewall portion of the first gate dielectric to a second sidewall portion of the second gate dielectric.

4. The integrated circuit device of claim 1, wherein:
   the first gate dielectric has a first bottom portion that extends between first sidewall portions and the second gate dielectric has a second bottom portion that extends between second sidewall portions; and
   the residual gate dielectric extends from the first sidewall portions of the first gate dielectric to the second sidewall portions of the second gate dielectric and does not extend from the first bottom portion of the first gate dielectric to the second bottom portion of the second gate dielectric.

5. The integrated circuit device of claim 1, wherein a thickness of the residual gate dielectric is tapered along a height direction of the first gate stack and the second gate stack.

6. The integrated circuit device of claim 1, further comprising:
first spacers disposed along sidewalls of the first gate stack;
second spacers disposed along sidewalls of the second gate stack; and
wherein the gate isolation feature further includes residual gate spacers that extend from the first spacers to the second spacers.

7. The integrated circuit device of claim 6, wherein a height of the residual gate spacers is less than a height of the first spacers and a height of the second spacers.

8. The integrated circuit device of claim 6, wherein the residual gate spacers include a first residual gate spacer and a second residual gate spacer, wherein a height of the first residual gate spacer is different than a height of the second residual gate spacer.

9. The integrated circuit device of claim 1, further comprising:
a first interlevel dielectric (ILD) layer disposed over a substrate, wherein the first gate stack and the second gate stack are disposed over the substrate in the first ILD layer; and
a second ILD layer disposed over the first ILD layer, wherein the dielectric layer of the gate isolation feature is a portion of the second ILD layer.

10. An integrated circuit device comprising:
a first gate structure that includes:
a first gate stack having a first gate electrode disposed over a first high-k gate dielectric, and
a first spacer and a second spacer disposed along sidewalls of the first gate stack, wherein the first high-k gate dielectric defines sidewalls of the first gate stack;
a second gate structure that includes:
a second gate stack having a second gate electrode disposed over a second high-k gate dielectric, and
a third spacer and a fourth spacer disposed along sidewalls of the second gate stack, wherein the second high-k gate dielectric defines sidewalls of the second gate stack;
a first high-k dielectric layer connected to the first high-k gate dielectric and the second high-k gate dielectric; and
a second high-k dielectric layer connected to the first high-k gate dielectric and the second high-k gate dielectric, wherein the first high-k dielectric layer is separated from the second high-k dielectric layer by an interlevel dielectric layer.

11. The integrated circuit device of claim 10, wherein the interlevel dielectric layer has a topmost surface that is above a topmost surface of the first gate structure and a topmost surface of the second gate structure, and the interlevel dielectric layer further has a bottommost surface that is below the topmost surface of the first gate structure and the topmost surface of the second gate structure.

12. The integrated circuit device of claim 10, wherein a height of the first high-k dielectric layer is less than a height of the second high-k dielectric layer.

13. The integrated circuit device of claim 10, wherein the first high-k dielectric layer and the second high-k dielectric layer have a tapered thickness.

14. The integrated circuit device of claim 10, further comprising:

a fifth spacer connected to the first spacer and the third spacer; and
a sixth spacer connected to the second spacer and the fourth spacer, wherein the first high-k dielectric layer is disposed along the fifth spacer and the second high-k dielectric layer is disposed along the sixth spacer.

15. The integrated circuit device of claim 14, wherein top surfaces of the first spacer, the second spacer, the third spacer, and the fourth spacer are above than top surfaces of the fifth spacer and the sixth spacer relative to a top surface of an isolation feature.

16. The integrated circuit device of claim 10, further comprising an isolation feature, wherein the first gate structure and the second gate structure are disposed over a top surface of the isolation feature, and further wherein the first high-k dielectric layer and the second high-k dielectric layer are not disposed on a portion of the top surface of the isolation feature that extends between the first gate structure and the second gate structure.

17. An integrated circuit device comprising:
a first fin and a second fin extending along a first direction;
an isolation feature disposed over a lower portion of the first fin and a lower portion of the second fin, such that the isolation feature separates the first fin from the second fin;
a first gate extending along a second direction that is different than the first direction, wherein the first gate is disposed over the isolation feature and an upper portion of the first fin;
a second gate extending along the second direction, wherein the second gate is disposed over the isolation feature and an upper portion of the second fin;
a residual gate dielectric that extends between the first gate and the second gate;
a first interlevel dielectric layer disposed over the isolation feature, wherein the first gate and the second gate are disposed in the first interlevel dielectric layer; and
a second interlevel dielectric layer disposed over the first interlevel dielectric layer, wherein a portion of the second interlevel dielectric layer is disposed between the first gate and the second gate along the second direction, and wherein the portion of the second interlevel dielectric layer is further disposed between the residual gate dielectric along the first direction.

18. The integrated circuit device of claim 17, wherein the second interlevel dielectric layer physically contacts a top surface of the isolation feature.

19. The integrated circuit device of claim 17, further comprising:
first source/drain features disposed over the first fin, wherein the first gate is disposed between the first source/drain features;
second source/drain features disposed over the second fin, wherein the second gate is disposed between the second source/drain features; and
wherein the portion of the second interlevel dielectric layer further extends below a topmost surface of the first interlevel dielectric layer between the first source/drain features and the second source/drain features.

20. The integrated circuit device of claim 17, wherein the residual gate dielectric is disposed between the second interlevel dielectric layer and residual spacers.

* * * * *